United States Patent
Watanabe et al.

(10) Patent No.: US 9,927,692 B2
(45) Date of Patent: Mar. 27, 2018

(54) REFLECTIVE PHOTOMASK AND PRODUCTION METHOD THEREFOR

(71) Applicant: Toppan Printing Co., Ltd., Tokyo (JP)

(72) Inventors: Genta Watanabe, Tokyo (JP); Tomohiro Imoto, Tokyo (JP); Norihito Fukugami, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 5 days.

(21) Appl. No.: 15/057,548

(22) Filed: Mar. 1, 2016

(65) Prior Publication Data

US 2016/0178997 A1   Jun. 23, 2016

Related U.S. Application Data

(63) Continuation of application No. PCT/JP2014/004438, filed on Aug. 28, 2014.

(30) Foreign Application Priority Data

Sep. 6, 2013 (JP) ................. 2013-185324

(51) Int. Cl.
*G03F 1/24* (2012.01)
*G03F 1/22* (2012.01)

(52) U.S. Cl.
CPC ..................... *G03F 1/24* (2013.01)

(58) Field of Classification Search
None
See application file for complete search history.

(56) References Cited

U.S. PATENT DOCUMENTS

| 2012/0135339 A1 | 5/2012 | Kim et al. |
| 2012/0237860 A1 | 9/2012 | Kim et al. |
| 2013/0004711 A1 | 1/2013 | Doi et al. |

FOREIGN PATENT DOCUMENTS

| JP | H02-3217 A | 1/1990 |
| JP | 2009-141223 A | 6/2009 |

(Continued)

OTHER PUBLICATIONS

Partial English translation of Notification of Reasons for Rejection, dated Dec. 22, 2015 in corresponding Japanese application No. 2015-535307.

(Continued)

*Primary Examiner* — Stephen Rosasco
(74) *Attorney, Agent, or Firm* — Foley & Lardner, LLP

(57) ABSTRACT

A reflective photomask includes: a substrate; a multilayer reflection film formed on the substrate and reflecting exposure light including light with a wavelength of about 5 nm to 15 nm for lithography; an absorption film formed on the multilayer reflection film and absorbing the exposure light, and formed therein with a circuit pattern or a circuit pattern forming region where the circuit pattern is formed; a shading region formed by removing part of the multilayer reflection film and the absorption film on the substrate, on an outer peripheral side of the circuit pattern or the circuit pattern forming region to shade part of the exposure light reflected by the multilayer reflection film; and a plurality of projections formed at a pitch of about 3000 nm or less on part of a surface of the substrate exposed in the shading region, and suppressing reflection of out-of-band light with a wavelength of about 140 nm to 800 nm included in the exposure light and incident on the shading region.

6 Claims, 28 Drawing Sheets

(56) References Cited

FOREIGN PATENT DOCUMENTS

| | | |
|---|---|---|
| JP | 2009-212220 A | 9/2009 |
| JP | 2012-208415 A | 10/2012 |
| JP | 2013-074195 A | 4/2013 |
| JP | 2013-074202 A | 4/2013 |
| WO | WO-2013/046627 A1 | 4/2013 |

OTHER PUBLICATIONS

Extended European Search Report issued in European Patent Application No. 14842142.3 dated Apr. 4, 2017.

FIG. 3
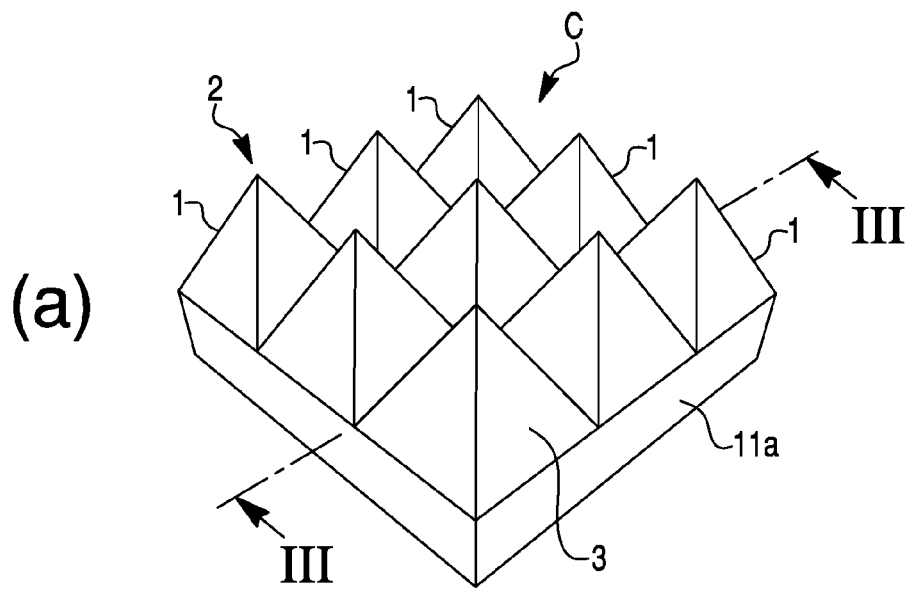
(a)
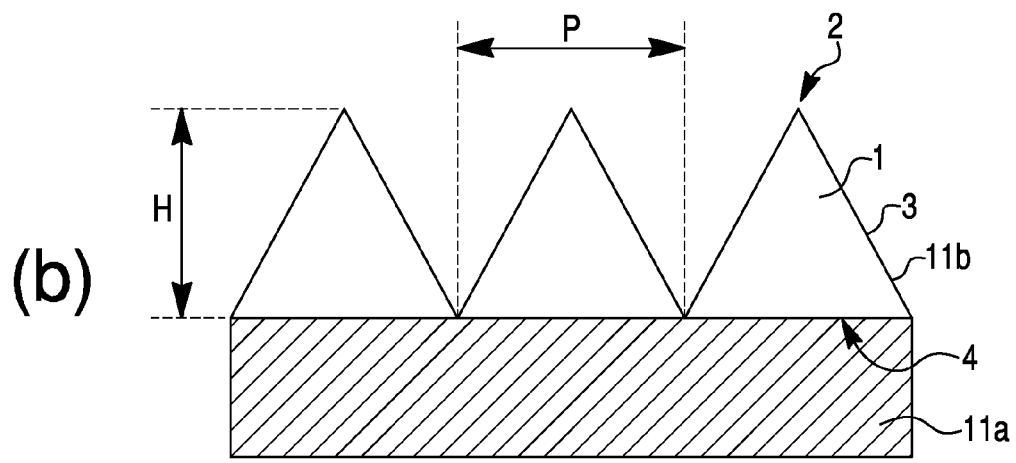
(b)

FIG. 5
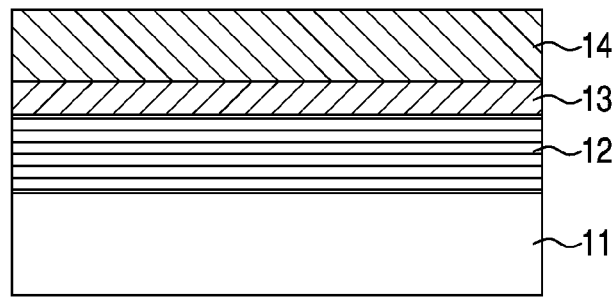
(a)
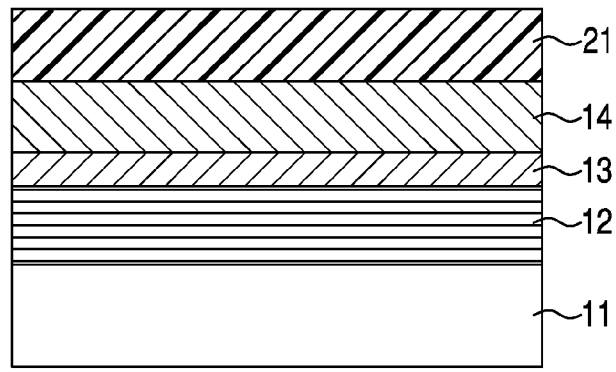
(b)
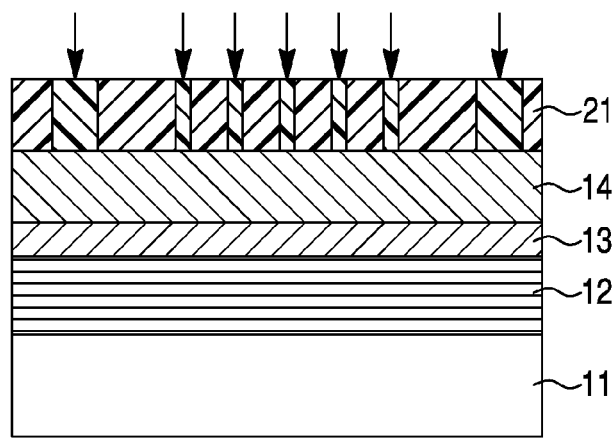
(c)

FIG. 6
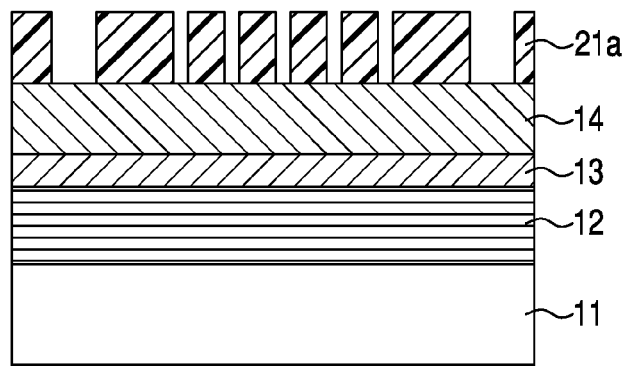
(a)
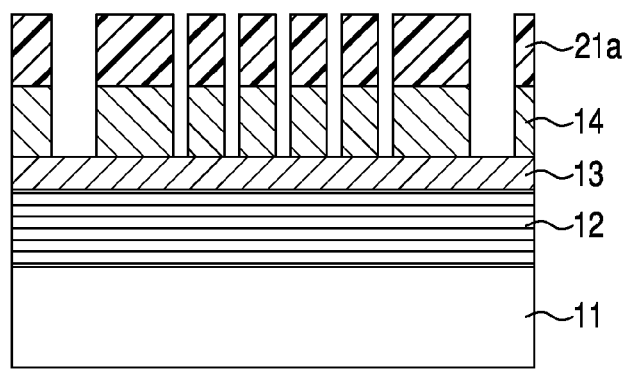
(b)
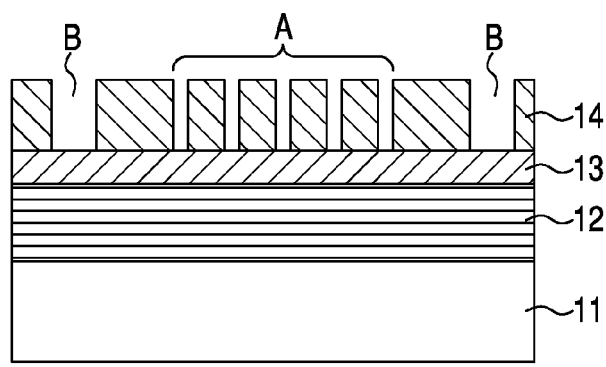
(c)

FIG. 7
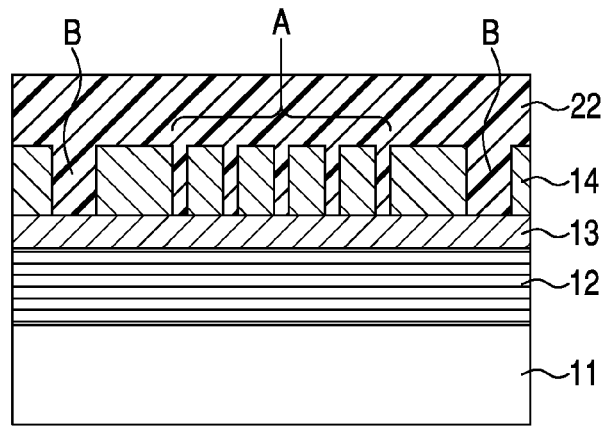
(a)
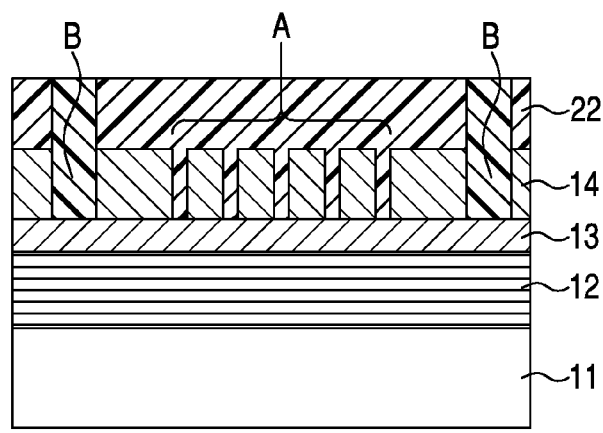
(b)
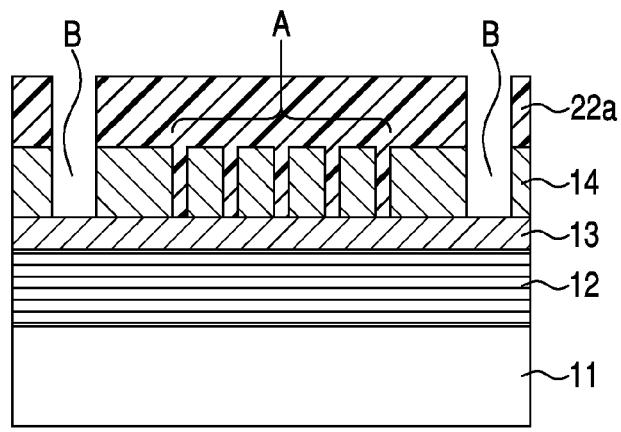
(c)

FIG. 8
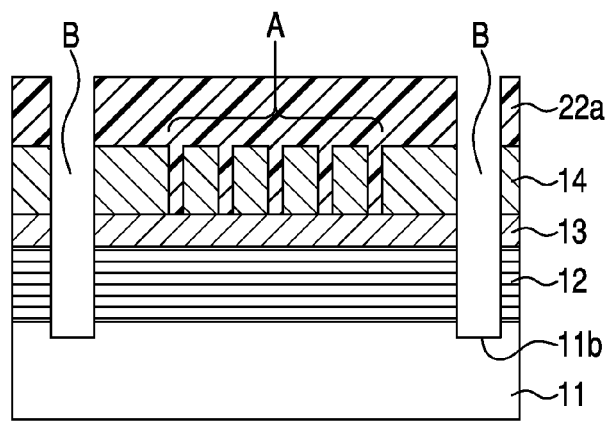
(a)
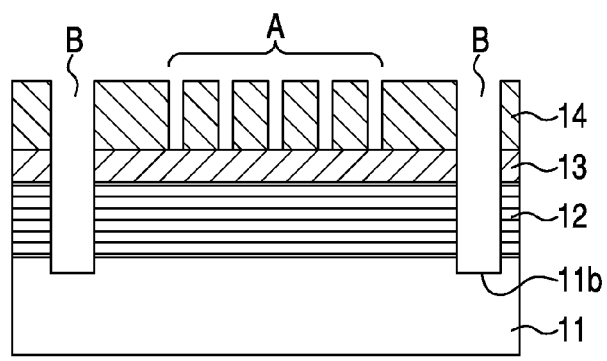
(b)
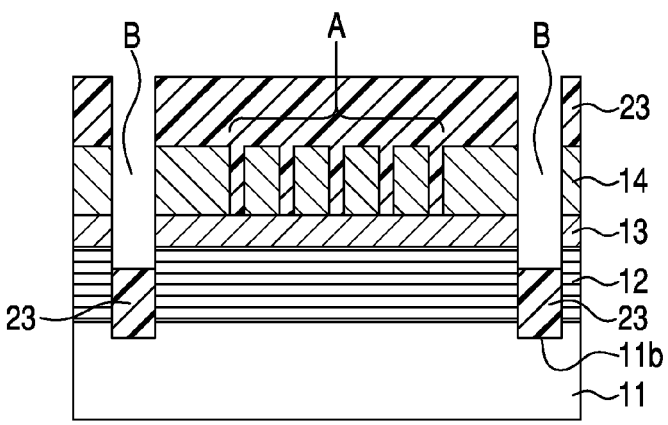
(c)

FIG. 9
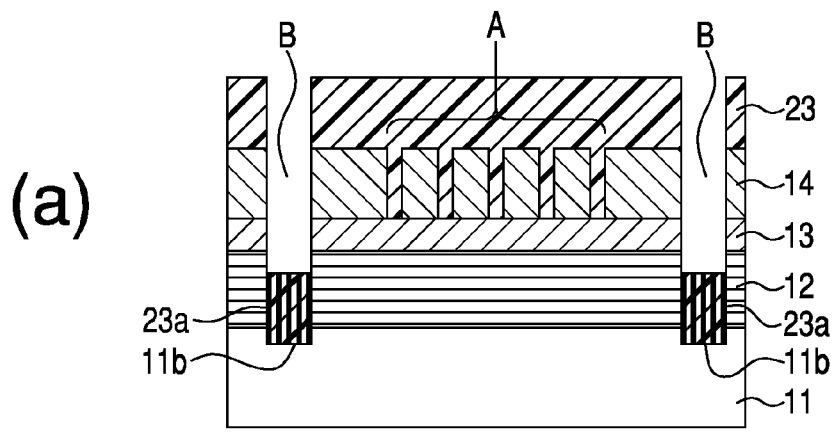
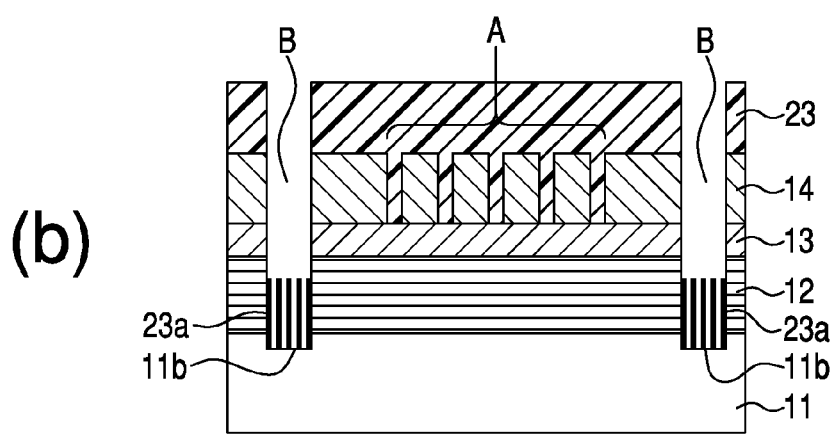
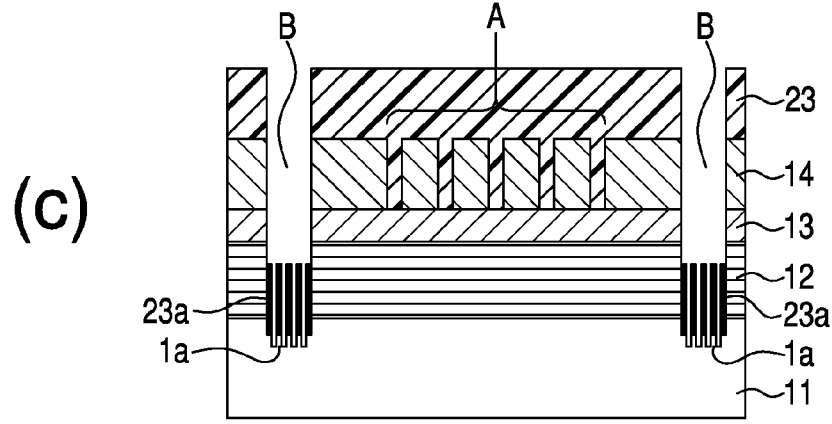

FIG. 10
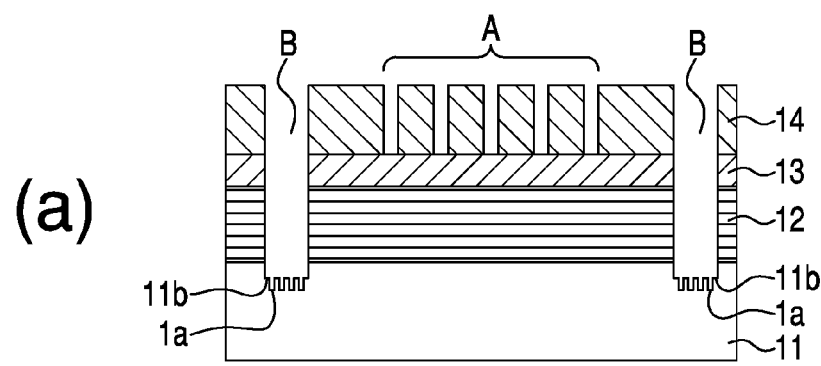
(a)
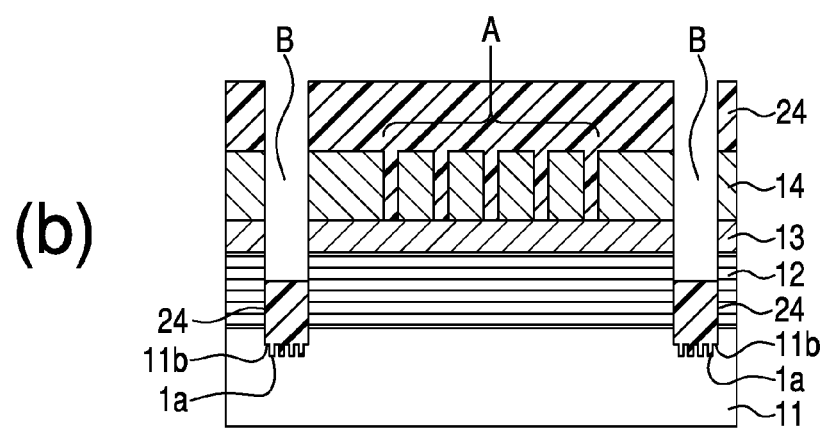
(b)
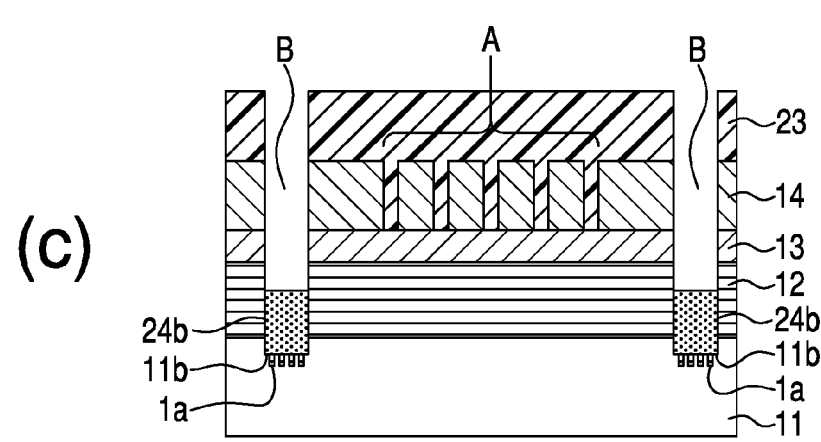
(c)

FIG. 11
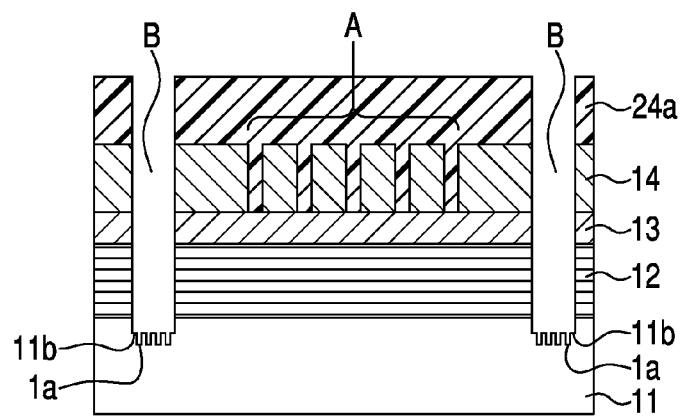
(a)
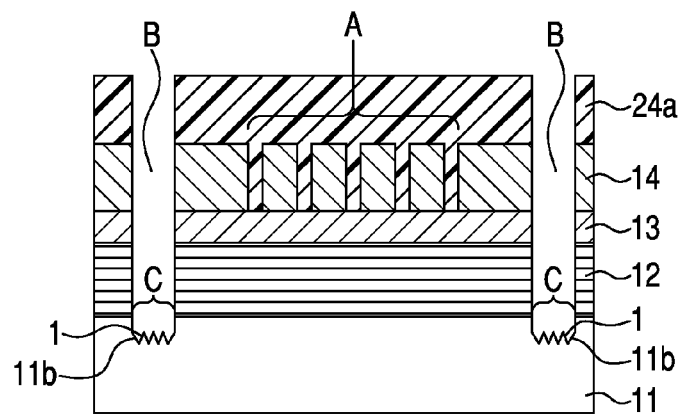
(b)
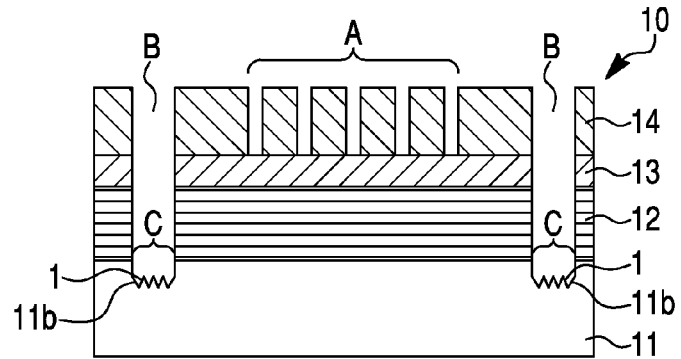
(c)

FIG. 15
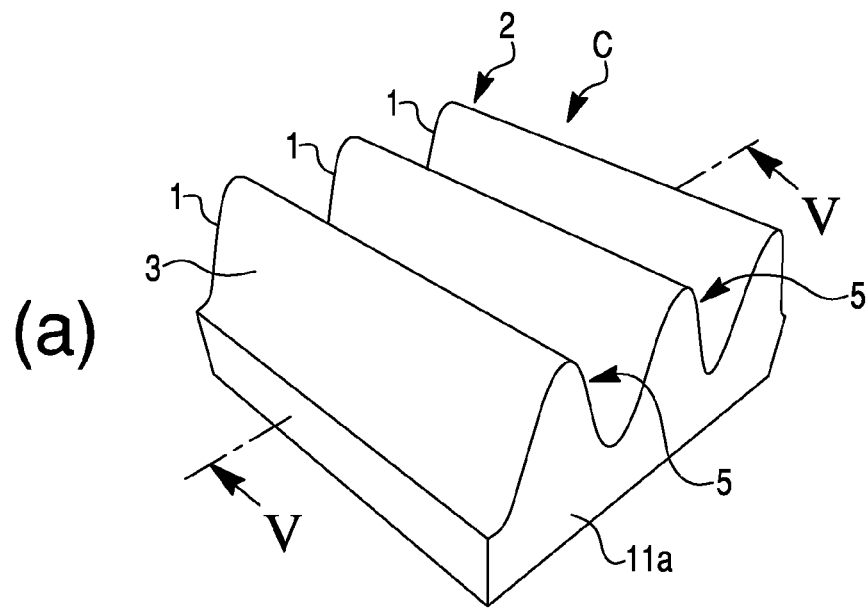
(a)
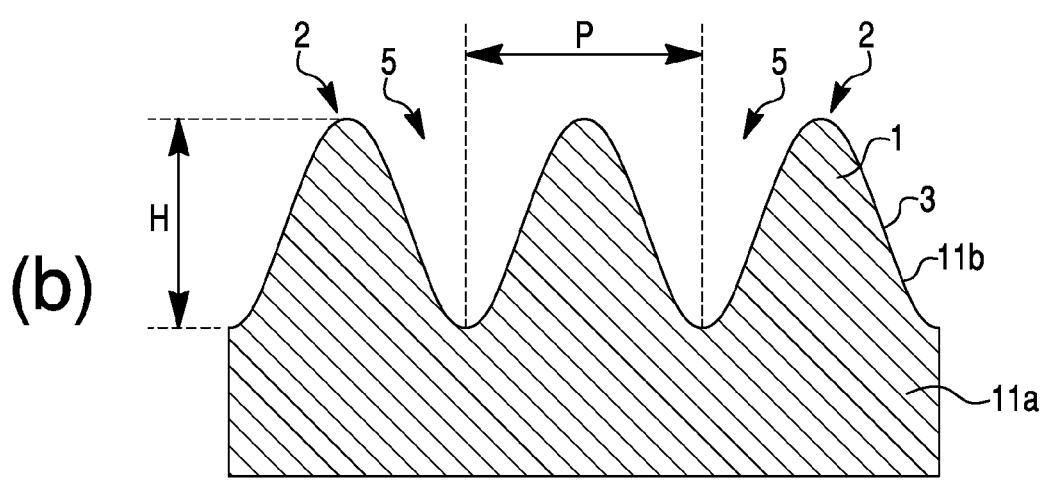
(b)

FIG. 16
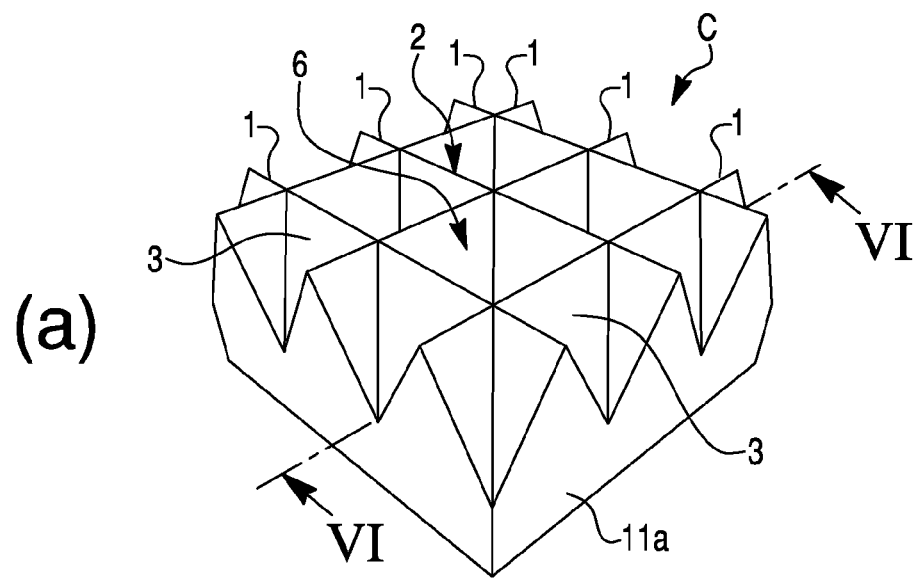
(a)
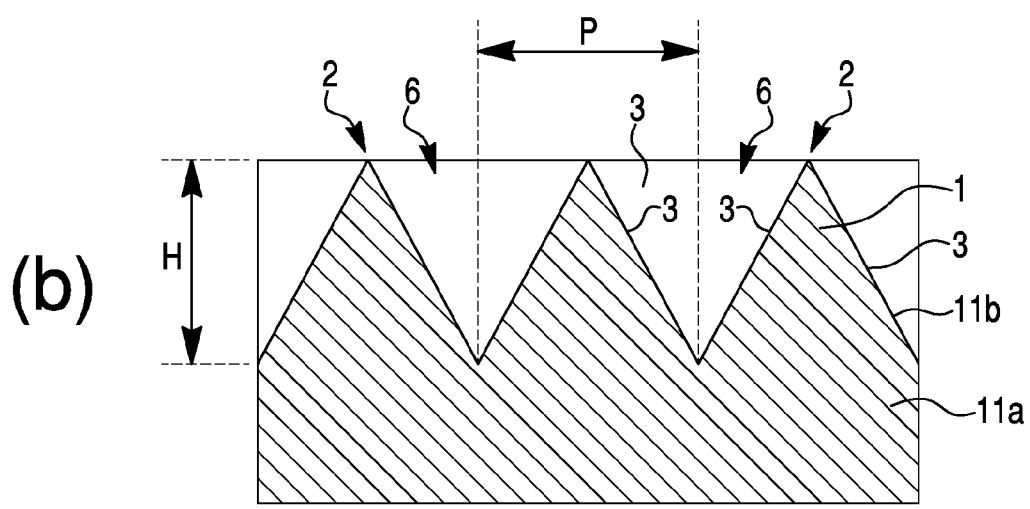
(b)

FIG. 19
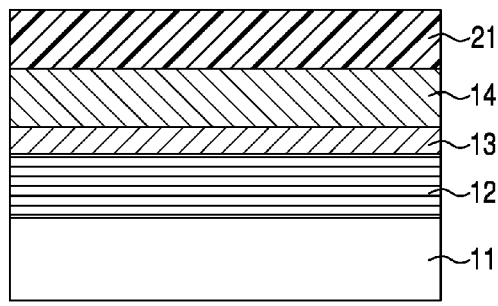
(a)
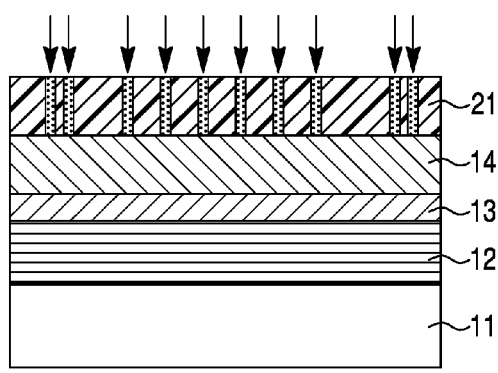
(b)
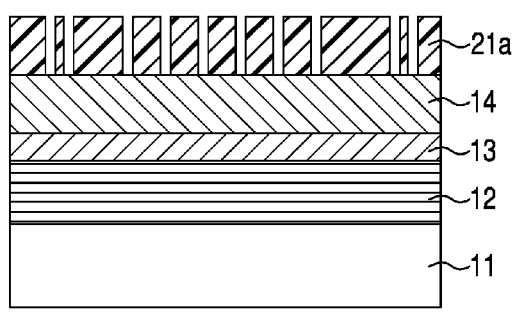
(c)
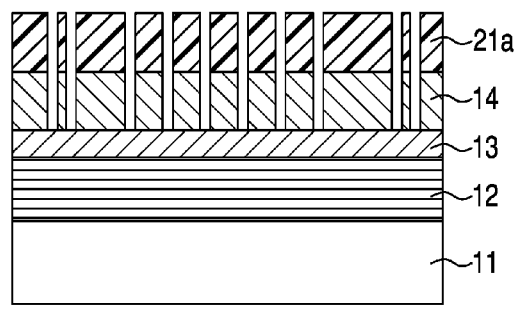
(d)
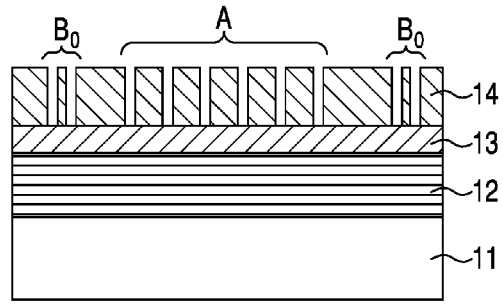
(e)

FIG. 21
(a)
Top View
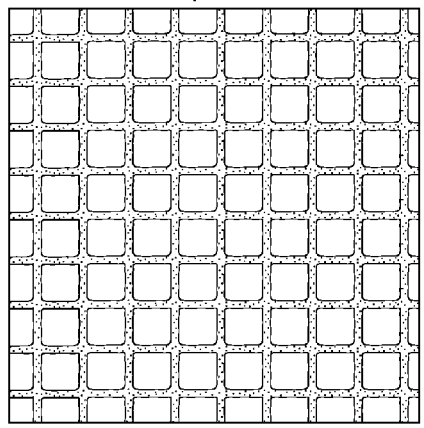
(b)
Cross Sectional Profile
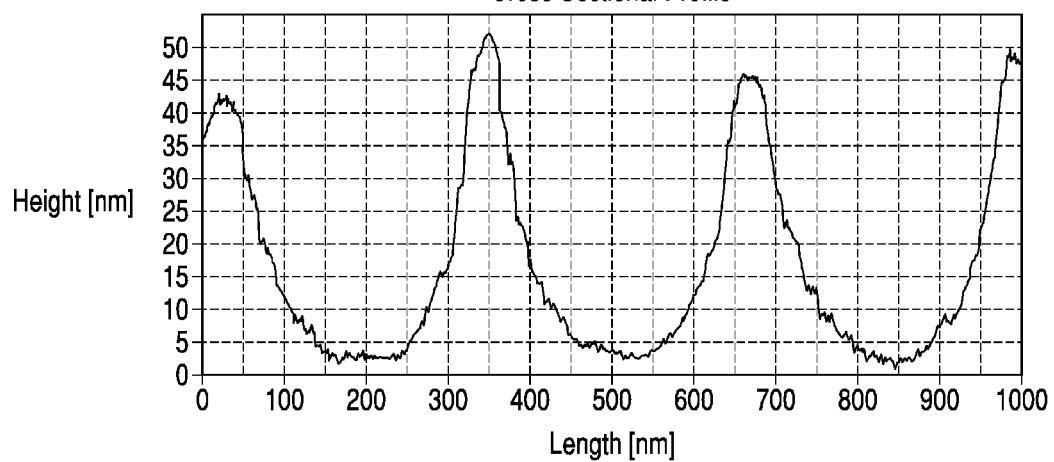

REFLECTIVE PHOTOMASK AND PRODUCTION METHOD THEREFOR

CROSS-REFERENCE TO RELATED PATENT APPLICATIONS

This application is a continuation application filed under 35 U.S.C. 111(a) claiming the benefit under 35 U.S.C. §§ 120 and 365(c) of PCT International Application No. PCT/JP2014/004438 filed on Aug. 28, 2014, which is based upon and claims the benefit of priority of Japanese Application No. 2013-185324, filed on Sep. 6, 2013, the entire contents of them all are hereby incorporated by reference.

TECHNICAL FIELD

The present invention relates to a reflective photomask (including a reflective photomask blank) for lithography.

BACKGROUND

As finer design is applied to semiconductor devices, there is an increasing need for developing finer processing with photolithography technique used for semiconductor device manufacturing processes. The exposure light for photolithography was mainly ArF excimer laser light of 193 nm around the year of 2000. However, the current trend is to apply light called extreme ultraviolet light (hereinafter referred to as EUV light) with a wavelength range of mainly 15 nm or less, particularly of 13.5 nm.

EUV light is very easily absorbed by nature by most substances. Therefore, instead of the transmissive photomasks based on conventional art, reflective photomasks are used for exposing EUV light (hereinafter referred to as EUV masks). Such an EUV mask is configured by, for example, forming a multilayer reflection film that includes a molybdenum (Mo) layer and a silicon (Si) layer, which are alternately laminated on a glass substrate, and forming a light absorption film having tantalum (Ta) as a main component on the multilayer reflection film, followed by forming a circuit pattern on the light absorption film.

Generally, in lithography using a reflective EUV mask, EUV light is made incident on the EUV mask at an angle of approximately six degrees, and the reflected EUV light is led to a wafer that is an object of exposure to expose an EUV light-sensitive resist formed on the wafer.

Thus, in performing lithography mentioned above, the optical axis of the EUV light incident on the EUV mask is inclined and the EUV light is reflected by the circuit pattern on the EUV mask. However, it is pointed out that, depending on the direction of the reflected light, a shadow is cast on a part of the light absorption film, causing a phenomenon of hindering irradiation of the EUV light onto the wafer (a projection effect). To minimize the projection effect, there is a method used for reducing the influence of the shadow by reducing the thickness of the light absorption film in which a circuit pattern is formed.

However, simply reducing the thickness of the light absorption layer leads to insufficiency in the light attenuation which the light absorption layer is originally required to exert. Therefore, there is a concern that the reflection of the EUV light irradiated to the resist on the wafer will increase more than necessary and thus the accuracy of forming a circuit pattern is degraded. In addition, in an actual exposure process, chips are often mounted on a single wafer in a multifaceted manner. Therefore, there is particularly a concern that the exposure of the resist increases in a boundary region where chips are adjacent to each other. Specifically, multiple exposures are unavoidably caused in the boundary region between the chips to adversely affect the accuracy of forming a circuit pattern. The multiple exposures will result in decreasing the quality and the throughput of chips obtained at a later stage. Therefore, when the light absorption layer is made thinner, a method of forming a groove is used. With this method, the EUV mask is grooved by removing the light absorption film and further removing the multilayer reflection film so as to reach the surface of the glass substrate surface (see PTL 1). This method is used for the purpose of using the groove as a shading region having high shading properties for the wavelengths of the EUV light, minimizing the reflection of the EUV light in the shading region, and minimizing multiple exposures in the boundary region between adjacent chips.

However, in many cases, light sources that generate EUV light emit not only light of the EUV range of about 13.5 nm but also light with a wavelength band covering from a vacuum ultraviolet range (about 140 nm) to a near infrared range (about 800 nm). This wavelength band is generally called out-of-band. Thus, on an EUV mask, light with the out-of-band wavelength (hereinafter referred to as out-of-band light) is also incident together with the EUV light. In the shading region of the EUV mask, the shading properties for EUV light are relatively high, whereas the shading properties for out-of-band light are relatively low. In the shading region, of the light emitted from a light source, reflection of the EUV light can be mostly prevented, however, part of the out-of-band light is reflected in the shading region and irradiated onto the wafer. This raises a problem of causing multiple exposures in the boundary region between the chips.

PTL 2 discloses a technique that can solve such a problem. According to this technique, a finely structured pattern is formed on a rear surface of a glass substrate, which is a surface opposite to the multilayer reflection film. By forming the pattern, after out-of-band light incident on a shading region has reached the rear surface of the glass substrate from vacuum, the reflection of the light on a rear surface conductive film is minimized.

CITATION LIST

Patent Literature

PTL 1: JP 2009-212220 A
PTL 2: JP 2013-074195 A

SUMMARY OF THE INVENTION

Technical Problem

For verification of the technique described in PLT 2, the inventor of the present invention checked the components of the out-of-band light that are reflected in the shading region and irradiated to the wafer. As a result of the check, it was found that the light reflected on the front surface of the substrate was more dominant than the light reflected on the rear surface of the substrate. It was concluded that, in order to reduce the reflectance of the out-of-band light that is incident on the shading region, it is not sufficient to prevent reflection of light on the rear surface of the substrate, but it is also necessary to prevent reflection on the front surface of the substrate.

The present invention has been made in view of the above issues and has an object of providing a reflective photomask capable of reducing reflectance of out-of-band light included in a light source of exposure light and reflected by a wafer that is an object of exposure more than in conventional art, in a reflective photomask having a shading region for reducing the influence of a projection effect.

Solution to Problem

In order to solve the problems, one aspect of a reflective photomask according to the present invention includes: a substrate; a multilayer reflection film formed on the substrate and reflecting exposure light including light with a wavelength of about 5 nm to about 15 nm for lithography; an absorption film formed on the multilayer reflection film and absorbing the exposure light, and formed therein with one of a circuit pattern and a circuit pattern forming region where the circuit pattern is formed; a shading region formed by removing part of the multilayer reflection film and the absorption film on the substrate, on an outer peripheral side of one of the circuit pattern and the circuit pattern forming region to shade part of the exposure light reflected by the multilayer reflection film; and a plurality of projections formed at a pitch of about 3000 nm or less on part of a surface of the substrate exposed in the shading region, for suppressing reflection of out-of-band light with a wavelength of about 140 nm to about 800 nm included in the exposure light and incident on the shading region.

The reflective photomask formed with a circuit pattern forming region where the circuit pattern is formed is a so-called mask blank.

The out-of-band light has a wavelength of about 140 nm to about 800 nm because there is almost no risk of the influence of exposure due to the light with a wavelength not included in this range. The exposure light has a wavelength of about 5 nm or more because this value is a lower limit of wavelengths of EUV light in practical use currently. The exposure light is of about 15 nm or less because the effect of fine processing, which is the characteristics of EUV photolithography, cannot be obtained with exposure light with a wavelength greater than that.

According to one aspect of the reflective photomask, in the shading region, a plurality of projections are formed with a short pitch of about 3000 nm or less in the interface between the substrate and the vacuum from which the exposure light is incident. Accordingly, of the out-of-band light which is irradiated together with the exposure light, the out-of-band light with a wavelength longer than the pitch of the projections is suppressed in diffraction. The reflection of such out-of-band light is suppressed on the front surface of incidence not on the rear surface of the substrate after the out-of-band light has transmitted the substrate.

In an aspect of the reflective photomask, the projections may be formed so as to have a diameter increased from the absorption film side toward the substrate. In addition, the projections may each have a side face that is a curved face.

An aspect of a method for manufacturing a reflective photomask according to the present invention includes: a step of laminating a multilayer reflection film on a substrate to reflect exposure light including light with a wavelength of about 5 nm to 15 nm for lithography; a step of laminating an absorption film on the laminated multilayer reflection film, the absorption film absorbing the exposure light and being formed therein with one of a circuit pattern and a circuit pattern forming region the circuit pattern is formed; a step of forming a shading region on an outer peripheral side of one of the circuit pattern and the circuit pattern forming region by removing part of the absorption film and the multilayer reflection film on the substrate, the shading region shading part of the exposure light reflected by the multilayer reflection film; and a step of forming a plurality of projections on part of a surface of the substrate exposed in the formed shading region, the projections suppressing reflection of out-of-band light included in the exposure light and having a wavelength of about 140 nm to 800 nm.

In an aspect of the method for manufacturing a reflective photomask, the step of forming the shading region may be integrally performed with the step of forming the plurality of projections to expose the surface of the substrate simultaneously with the formation of the projections.

Advantageous Effects of the Invention

According to the present invention, a reflective photomask formed with a shading region that reduces the influence of a projection effect. The reflective photomask is capable of suppressing reflection of out-of-band light irradiated to a wafer that is an object of exposure more than in conventional art. The reflective photomask is also capable of effectively suppressing multiple exposures in the boundary region between chips caused not only by EUV light but also by the out-of-band light chips are mounted on the surfaces of a wafer in a multifaceted manner. The reflective photomask is also capable of transferring a circuit pattern of high accuracy to the wafer and improving the throughput.

BRIEF DESCRIPTION OF THE DRAWINGS

FIG. 3 shows diagrams each illustrating projections of the reflective photomask according to the first embodiment;

FIG. 5 shows cross-sectional views each illustrating the method for manufacturing the reflective photomask according to the first embodiment;

FIG. 6 shows cross-sectional views each illustrating the method for manufacturing the reflective photomask according to the first embodiment;

FIG. 7 shows cross-sectional views each illustrating the method for manufacturing the reflective photomask according to the first embodiment;

FIG. 8 shows cross-sectional views each illustrating the method for manufacturing the reflective photomask according to the first embodiment;

FIG. 9 shows cross-sectional views each illustrating the method for manufacturing the reflective photomask according to the first embodiment;

FIG. 10 shows cross-sectional views each illustrating the method for manufacturing the reflective photomask according to the first embodiment;

FIG. 11 shows cross-sectional views each illustrating the method for manufacturing the reflective photomask according to the first embodiment;

FIG. 15 shows diagrams each illustrating projections of a reflective photomask according to a third embodiment;

FIG. 16 shows diagrams each illustrating projections of a reflective photomask according to a fourth embodiment;

FIG. 19 shows cross-sectional views each illustrating a process of manufacturing a reflective photomask according to Example 2 of the fifth embodiment;

FIG. 21 shows charts each illustrating the reflective photomask according to Example 2 of the fifth embodiment;

DESCRIPTION OF REPRESENTATIVE EMBODIMENTS

Figure 1:
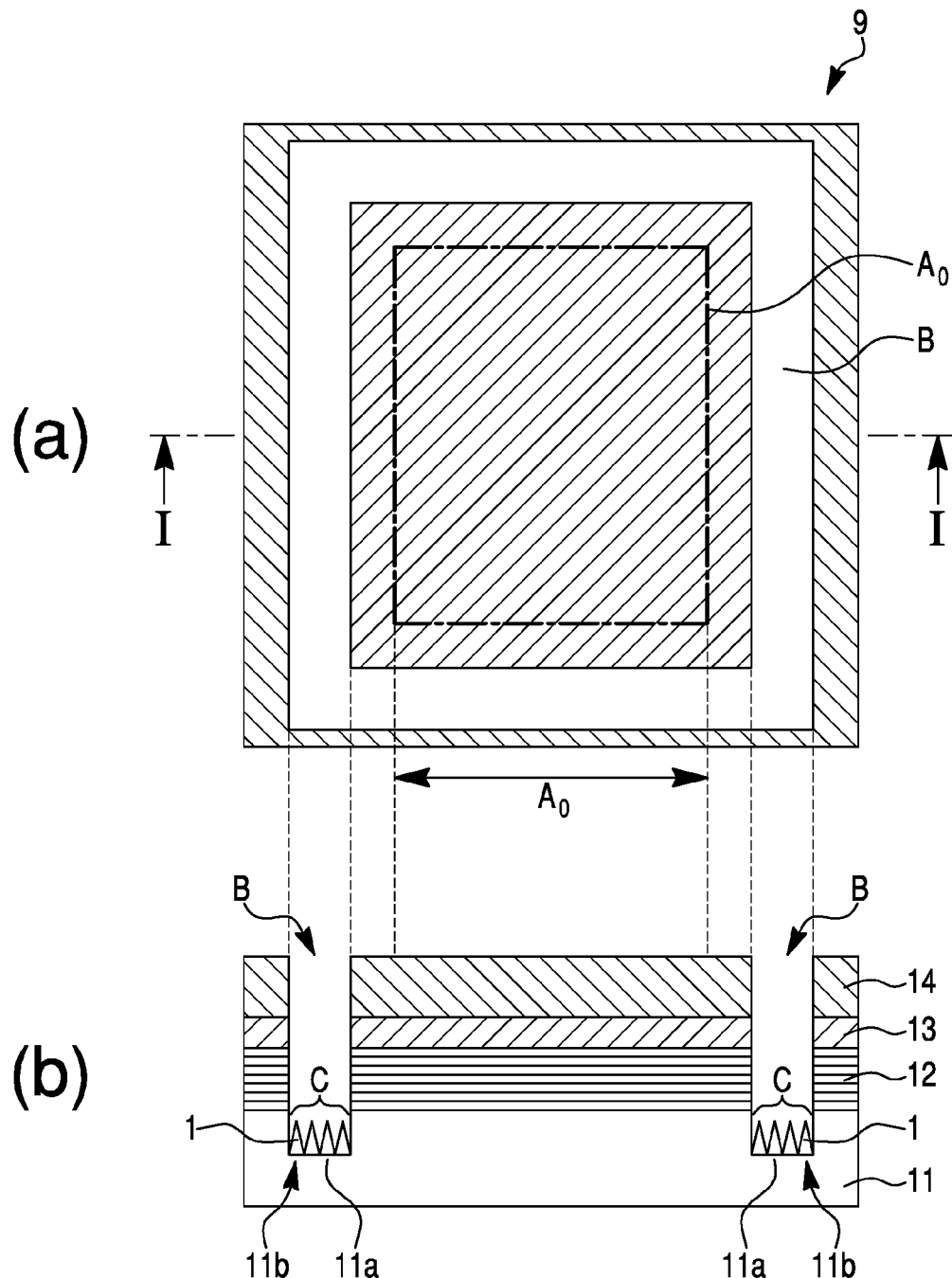
FIG. 1 shows diagrams each illustrating a reflective photomask blank according to a first embodiment.

In detailed description below, to provide full understanding of the embodiments of the present invention, many specific details are described. However, it is obviously possible to implement one or more embodiments without such specific details. Moreover, to simplify the drawings, known structures and devices are illustrated schematically.

A reflective photomask according to the present invention is described using first to seventh embodiments. The first embodiment relates to a reflective photomask and a method for manufacturing the same. The second to fourth embodiments relate to structures of a reflective photomask. The fifth to seventh embodiments relate to methods of manufacturing a reflective photomask. A description is given below starting from the first embodiment.

First Embodiment

A reflective photomask (including a reticle) according to the first embodiment is used for EUV lithography that uses exposure light with a wavelength from about 5 nm to 15, particularly EUV light at 13.5 nm. The EUV lithography is performed using an exposure apparatus that is located in a chamber. The exposure apparatus is equipped with a discharge or laser-excited plasma light source. EUV light emitted from the plasma light source is incident on the reflective photomask according to the present embodiment. Then, the reflected EUV light is passed through a predetermined route and then irradiated onto a resist on a wafer that is an object of exposure to expose the resist to light.

The reflective photomask according to the first embodiment is used to suppress reflection of out-of-band light having a wavelength from about 140 nm to 800 nm and emitted with the EUV light from the plasma light source to suppress unnecessary exposure of the resist on the wafer. With reference to the drawings, the configuration of the first embodiment is described below. In the drawings, the number, the amount, the shape, the size, or the proportion of the structure, the film, and the like is illustrated by appropriate simplification and exaggeration. These matters apply to the descriptions of other embodiments.

Figure 2:
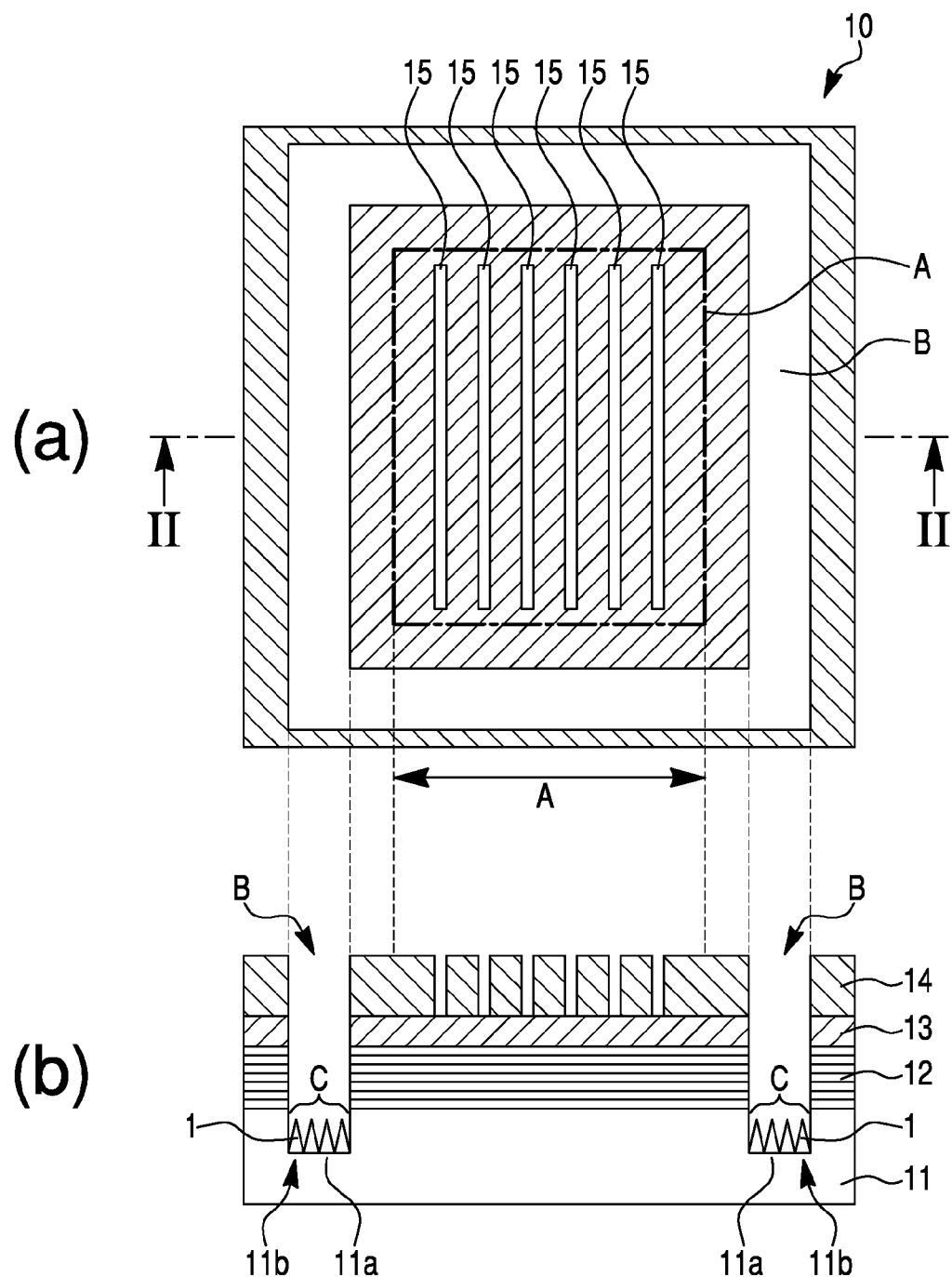
FIG. 2 shows diagrams each illustrating a reflective photomask according to the first embodiment.

FIG. 1 illustrates by (a) and (b) a reflective photomask blank 9, and FIG. 2 illustrates by (a) and (b) a reflective photomask 10. FIG. 1 illustrates by (a) a plan view of the reflective photomask blank 9, and FIG. 1 illustrates by (b) a cross-sectional view taken along the line I-I of (a) of FIG. 1. FIG. 2 shows diagrams each illustrating the reflective photomask 10. FIG. 2 shows by (a) a plan view of the reflective photomask 10, and by (b) a cross-sectional view taken along the line II-II of (a) of FIG. 2.

As illustrated in FIG. 1 by (b), the reflective photomask blank 9 is provided with a substrate 11, a multilayer reflection film 12 formed on a surface (upper side in (b) of FIG. 1) of the substrate 11, a protective film 13 formed on the multilayer reflection film 12, and an absorption film 14 formed on the protective film 13. A rear surface of the substrate 11 (lower side in (b) of FIG. 1), which surface is opposite to the multilayer reflection film 12, is formed thereon with a rear surface conductive film, not shown.

As indicated by a dash dotted line in (a) of FIG. 1, the reflective photomask blank 9 has a circuit pattern forming region $A_0$ in the center of the absorption film 14. The circuit pattern forming region $A_0$ is a region where a circuit pattern 15 is formed at a later stage. As indicated by a dash dotted line in (a) of FIG. 2, the predetermined circuit pattern 15 is formed inside the circuit pattern forming region $A_0$, which serves as a circuit pattern region A of the reflective photomask 10.

As just described, the reflective photomask blank 9 and the reflective photomask 10 differ only in whether the circuit pattern 15 is formed and they have the same configuration other than that. Accordingly, reflective photomask referred to in the description below consequently includes a reflective photomask blank unless otherwise specified.

In the reflective photomask 10, a shading region B is formed, on an outer peripheral side of the circuit pattern forming region $A_0$, for shading of the reflection of the EUV light by removing part of the multilayer reflection film 12, the protective film 13, and the absorption film 14 down to the position of exposing the substrate 11. The shading region B shades part of exposure light reflected by the multilayer reflection film 12. In the area where the substrate 11 is exposed in the shading region B, a plurality of projections 1 are formed on a base 11a of the substrate 11. By the plurality of projections 1, a fine concave-and-convex pattern C is formed on a surface 11b of the substrate 11.

A material desirable for the substrate 11 is provided with properties suitable for the processing of forming the fine concave-and-convex pattern C on the surface of the substrate 11. Such a material may contain, for example, quartz ($SiO_2$) as a main component and titanium oxide ($TiO_2$). When the lithography technique and the etching technique are used as the processing technique, quartz glass is desired to be used for the material for the substrate 11. In the present embodiment, ultra-low thermal expansion glass that uses quartz ($SiO_2$) (manufactured by Corning, refractive index ranging 1.4801-1.4892) is used.

The multilayer reflection film 12 is a film that reflects EUV light. The material used for the film has low EUV light absorption (attenuation coefficient) and a large refractive difference of EUV light between laminated films. The multilayer reflection film 12 is designed to achieve the reflectance of approximately 72% of EUV light in theory. For example, the film 12 is configured by alternately laminating a molybdenum (Mo) layer with a thickness of 2 to 3 nm and a silicon (Si) layer with a thickness of 4 to 5 nm by 40 to 50 pairs. The molybdenum (Mo) layers and the silicon (Si) layers have low absorption (attenuation coefficient) for EUV light and large difference in refractive index from EUV light, and thus the reflectance at the interfaces of these layers can be configured to be high.

It is necessary that the protective film 13 has a material having washing resistance against acid and alkali. For example, ruthenium (Ru) with a thickness of 2 to 3 nm or silicon (Si) with a thickness of approximately 10 nm may be used for the film 13.

When the protective film 13 is configured by ruthenium (Ru), the protective film 13 plays a role of a stopper layer in the processing of the absorption film 14, or a protective layer for chemicals used in washing the mask. The multilayer reflection film 12 has an uppermost layer that is a Si layer which is placed beneath the protective film 13 composed of ruthenium (Ru).

When the protective film 13 is configured by silicon (Si), a buffer layer (not shown) may be provided between the protective film 13 and the absorption film 14. In this case, the buffer layer is provided to protect the silicon (Si) layer placed beneath the buffer layer during etching and pattern correction of the absorption film 14. The buffer layer may be configured by, for example, a nitrogen compound of chromium (CrN).

The protective film 13 may have a single layer structure or a laminated structure. When the protective film 13 has a laminated structure, uppermost layer thereof is formed using a material containing any of ruthenium (Ru) or its oxide, nitride or oxynitride, or silicon (Si) or its oxide, nitride or oxynitride.

The absorption film 14 is a film that absorbs EUV light and may have a single layer structure or a double layer structure. The absorption film 14 having a single layer structure is formed, for example, using a material containing any of tantalum (Ta) or its oxide, nitride or oxynitride that has a high index of absorption for EUV light. Specifically, tantalum boron nitride (TaBN), tantalum silicon (TaSi), tantalum (Ta), or an oxide thereof (TaBON, TaSiO, or TaO) may be used. The absorption film 14 having a double layer structure may be provided, as an upper layer, with a low reflective layer (not shown) having an antireflection function relative to ultraviolet light with a wavelength of 190 to 260 nm.

For the low reflective layer, for example, a material containing any of oxides, nitrides or oxynitrides of tantalum (Ta) and oxides, nitrides or oxynitrides of silicon (Si) may be used. The low reflective layer is used for improving inspectability by enhancing the contrast relative to the inspection wavelength of a defect inspection machine for the mask. The absorption film 14 has a thickness of 50 to 70 nm.

The rear surface conductive film only has to have electrical conductivity and is formed, for example, using a material containing a metal of chromium (Cr) or tantalum (Ta), or any of its oxide, nitride, and oxynitride, or another electrically conductive metal material. Specifically, CrN is often used. The rear surface conductive film has a thickness of 20 to 400 nm.

The multilayer reflection film 12, the protective film 13, the absorption film 14, and the rear surface conductive film may be formed by sputtering and the like.

The projections 1 are described. The projections 1 correspond to a unit configuring the fine concave-and-convex pattern C on the surface 11b of the substrate 11 and minimize reflection of the out-of-band light incident on the concave-and-convex pattern C. As illustrated in FIG. 2 by (b), the projections 1 are formed so as to increase its diameter from the absorption film 14 side toward the substrate 11. Several projections 1 are arranged on the base 11a of the substrate 11 in the shading region B. The projections 1 have apices at a level approximately the same as the level of the boundary between the substrate 11 and the multilayer reflection film 12.

Referring to (a) and (b) of FIG. 3, the specific structure of the projections 1 is described. FIG. 3 shows by (a) a schematic perspective view illustrating some of the plurality of projections 1 that are arranged on the base 11a of the substrate 11, and by (b) a cross-sectional view taken along the line of (a).

As illustrated in FIG. 3 by (a) and (b), the projections 1 are each formed by processing part of the substrate 11 in an approximately pyramidal shape and each have an apex 2, four side faces 3 in an approximately equilateral triangular shape, and a bottom face 4 in an approximately square shape. That is, the projections 1 are each in a square pyramidal shape, where the length of a vertical line drawn from the apex 2 to the bottom face 4 is a height H.

The concave-and-convex pattern C formed by the projections 1 shows a dot pattern with the apices 2 in a planar view of the reflective photomask 10. At the position where the concave-and-convex pattern C is formed on the surface 11b of the substrate 11, a level difference is given to the surface 11b of the substrate 11. Between the substrate 11 and the vacuum outside the substrate 11, the volume ratio changes smoothly from the substrate 11 side toward the vacuum side in a direction of height of the projections 1.

The plurality of projections 1 are densely arranged adjacent to each other with a constant pitch P on the base 11a without exposing the flat surface 11b of the substrate 11. As illustrated in FIG. 3 by (b), the pitch P is a length between the valleys in the first embodiment. The pitch P is set to a length shorter than 800 nm. The pitch P of the first embodiment set to a length shorter than 800 nm corresponds to the matter that the out-of-band light to be removed has the wavelength range of about 140 nm to 800 nm. The pitch P contributes to efficiently suppressing the interference of the out-of-band light.

The working density of the out-of-band light having a wavelength range of about 140 nm to 400 nm is larger than the wavelength range of about 400 nm to 800 nm. Accordingly, by setting the pitch P within a range of less than 400 nm, the reflection of the out-of-band light can be more effectively suppressed. In a wavelength range of about 200 nm to 300 nm, the working density is particularly large.

Accordingly, by setting the pitch P within a range of less than 300 nm, thus the reflection of the out-of-band light can be further effectively suppressed. When the pitch P is set within a range of less than 200 nm, the reflection of the out-of-band light can be much more effectively suppressed.

Since light has properties as wave, reflection with a wavelength shorter than the half wavelength contributes to suppressing the interference caused by the incident wave and the reflected wave.

It is taken that the pitch P is set to a range of more than about 140 nm but less than 400 nm (e.g. 150 nm). In this case, as described above, the reflection of the out-of-band light with a wavelength range longer than the pitch P (150 nm) is effectively suppressed firstly in the fine concave-and-convex pattern C of the projections 1. Simultaneously, the reflection of the out-of-band light with a wavelength range longer than the wavelength twice the pitch P (in this case, 300 nm) is also suppressed effectively.

(Method for Manufacturing Reflective Photomask)

A method for manufacturing the reflective photomask 10 according to the first embodiment will be described. In the manufacturing method of the first embodiment, the substrate 11 is firstly exposed in the shading region B, and then the projections 1 are formed in the area where the substrate 11 is exposed.

As an overview, the substrate 11 is prepared firstly and the multilayer reflection film 12 is laminated on the substrate 11, and then the absorption film 14 is laminated on the multilayer reflection film 12. Then, the multilayer reflection film 12 and the absorption film 14 in a region of serving as the shading region B are selectively removed by the lithography technique and the etching technique. Thus, the shading region B is formed on the outer peripheral side of the circuit pattern region A or the circuit pattern forming region $A_0$. Then, the plurality of projections 1 are formed in the area where the substrate 11 is exposed in the shading region B, thereby the fine concave-and-convex pattern C is formed on the surface 11b of the substrate 11.

In forming the projections 1, a patterning method, such as a micromachining method and a laser machining method, for example, may be selected and used. Particularly, the lithography technique and the etching technique are preferred from a viewpoint of accurately forming the concave-and-convex pattern C.

Figure 4:
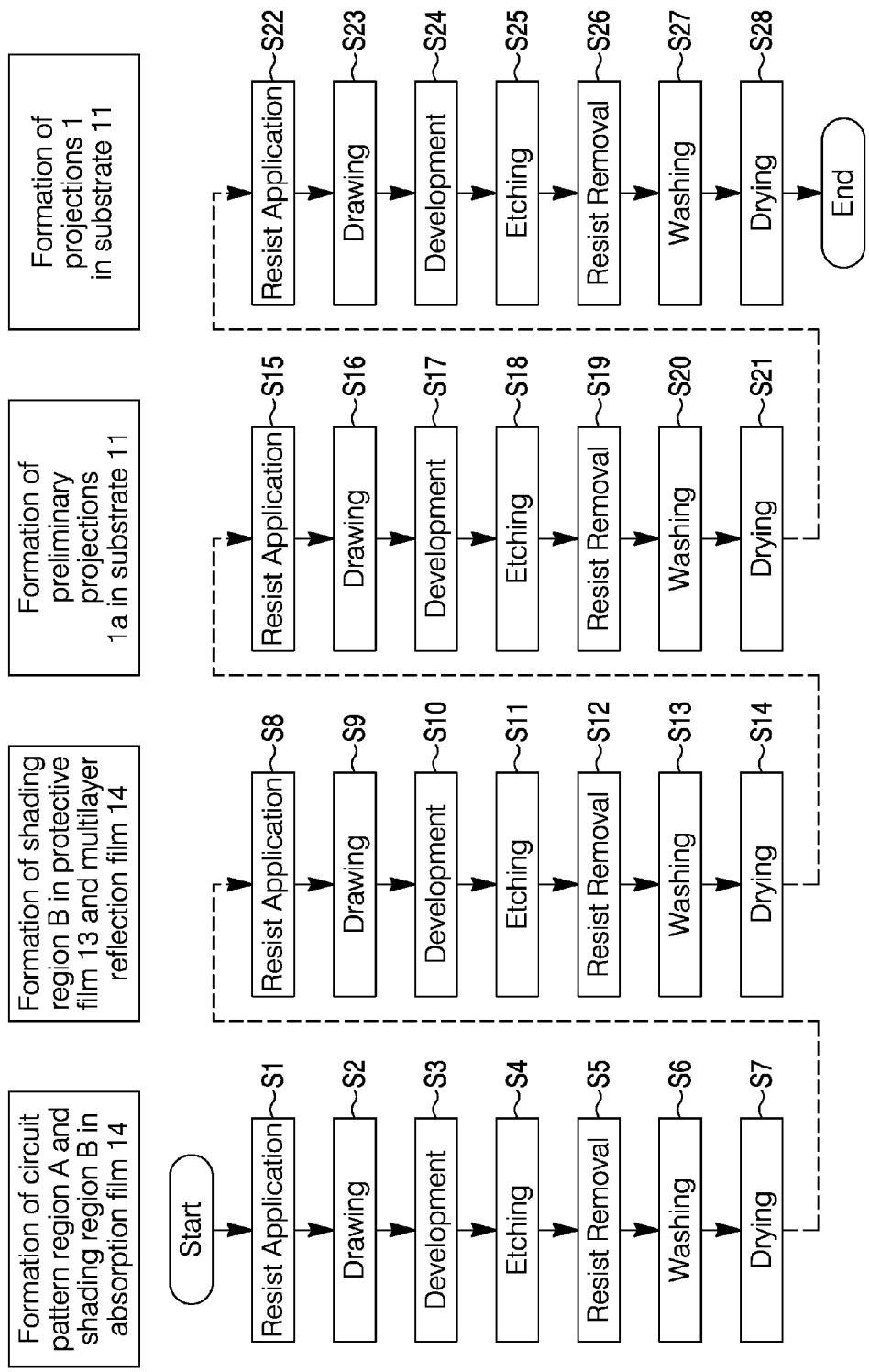
FIG. 4 is a flow chart illustrating a method for manufacturing the reflective photomask according to the first embodiment.

FIGS. 4 to 11 show a specific manufacturing method. FIG. 4 illustrates a flow chart of the manufacturing process and FIGS. 5 to 11 illustrate cross sections of the reflective photomask during the manufacturing process.

Firstly, a process of forming the circuit pattern region A and the shading region B in the absorption film 14 (S1 to S7) is described. Prior to this process, steps of laminating the multilayer reflection film 12 on the substrate 11, laminating the protective film 13 on the multilayer reflection film 12, and laminating the absorption film 14 on the protective film 13 are completed already. FIG. 5 shows by (a) the reflective photomask in this state.

Then, as illustrated in FIG. 5 by (b), a chemically amplified or non-chemically amplified resist 21 that reacts with ultraviolet rays or electron beam is applied onto the absorption film 14 (step S1). Then, as illustrated in FIG. 5 by (c), a pattern corresponding to the circuit pattern region A and the shading region B is drawn by irradiating ultraviolet rays or electron beams on the resist 21 (step S2).

Then, as illustrated in FIG. 6 by (a), the reflective photomask is developed in an alkaline solution or the like (step S3) to form a resist pattern 21a corresponding to the circuit pattern region A and the shading region B on the absorption film 14. Then, as illustrated in FIG. 6 by (b), the reflective photomask is subjected to etching by gas plasma with the resist pattern 21a as an etching mask, using a fluorine based gas or a chlorine based gas (step S4).

Then, as illustrated in FIG. 6 by (c), the unnecessary resist pattern 21a is removed from the reflective photomask by ashing using oxygen plasma, decomposition with an oxidizing agent, such as sulfuric acid or ozone water, or dissolution in an organic solvent or the like (step S5). Then, a washing process is performed for the reflective photomask, as necessary, using ultrapure water in which acid/alkali based chemicals, an ozone gas, a hydrogen gas, or the like is dissolved, organic alkaline based chemicals, or a surfactant, or the like (step S6). In addition, drying is performed by spinning or the like utilizing a centrifugal force (step S7) to form the circuit pattern region A and the shading region B in the absorption film 14.

Hereinafter, a process of forming the shading region B in the protective film 13 and the multilayer reflection film 12 is described (S8 to S14).

Firstly, as illustrated in FIG. 7 by (a), a resist 22 that reacts with ultraviolet rays or electron beams is applied onto the reflective photomask that has been processed through the steps up to step S7 (step S8). Thus, the resist 22 is applied to the circuit pattern region A and the shading region B of the absorption film 14.

Then, ultraviolet rays or electron beams for lithography is irradiated to the position corresponding to the shading region B on the resist 22 (step S9). Then, as illustrated in FIG. 7 by (c), similar to the above, the reflective photomask is developed (step S10) to form a resist pattern 22a.

Then, as illustrated in FIG. 8 by (a), using the resist pattern 22a as an etching mask, the protective film 13 and the multilayer reflection film 12 are etched (step S11). Thus, the shading region B is formed through these two films, thereby deepening the shading region. The shading region B reaches the substrate 11 and the surface 11b of the substrate 11 is exposed. The surface 11b at this point is flat.

In the etching, firstly, the protective film 13 is selectively removed using fluorine based gas plasma, and then the multilayer reflection film 12 is selectively removed. Similar to the protective film 13, the multilayer reflection film 12 may be removed using fluorine based gas plasma or chlorine gas based plasma.

Then, as illustrated in FIG. 8 by (b), the resist pattern 22a is removed from the reflective photomask (step S12), the reflective photomask is washed (step S13), the reflective photomask is dried (step S14), thereby forming the shading region B where the surface 11b of the substrate 11 is exposed.

Subsequently, a process of forming the plurality of projections 1 in the area where the substrate 11 is exposed is described. In this process, the surface 11b of the substrate 11 turns to a surface having the concave-and-convex pattern C from the flat surface. This process may be divided into a process of forming preliminary projections 1a that is a stage prior to sharpening the upper ends of the projections 1, (S15 to S21) and a process of forming the projections 1 on the basis of the preliminary projections 1a (S22 to S28).

Firstly, the process of forming the preliminary projections 1a is described. As illustrated in FIG. 8 by (c), a resist 23 that reacts with ultraviolet rays or electron beams is applied onto the reflective photomask that has been processed through the steps up to step S14 (step S15). In this case, the resist 23 is applied onto the absorption film 14 and the substrate 11 that is exposed in the shading region B.

Then, as illustrated in FIG. 9 by (a), ultraviolet rays or electron beams are irradiated to the resist 23 on the substrate 11 exposed in the shading region B to draw a pattern having an interval according to the desired pitch P of the projections 1 on the resist 23 (step S16). In this case, when the concave-and-convex pattern C of the projections 1 is desired to be in a dot pattern, the dot pattern is drawn on the resist 23.

Then, as illustrated in FIG. 9 by (b), the reflective photomask is developed (step S17) to form a resist dot pattern 23a on the substrate 11 exposed in the shading region B. Then, as illustrated in FIG. 9 by (b), using the resist dot pattern 23a as an etching mask, the substrate 11 is etched (step S18). Thus, the plurality of preliminary projections 1a are formed on the surface 11b of the substrate 11 that is exposed in the shading region B.

Then, as illustrated in FIG. 10 by (a), the resist 23 and the resist dot pattern 23a are removed from the reflective photomask (step S19), the reflective photomask is washed (step S20), the reflective photomask is dried (step S21), thereby forming the preliminary projections 1a on the surface 11b of the substrate 11 that is exposed in the shading region B.

Hereinafter, the process of forming the projections 1 on the basis of the preliminary projections 1a is described. Firstly, as illustrated in FIG. 10 by (b), a resist 24 that reacts with ultraviolet rays or electron beam is applied onto the reflective photomask that has been processed through the steps up to step S21 (step S22). In this case, the resist 24 is applied onto the absorption film 14, the circuit pattern region A, and the surface 11b of the substrate 11 that is exposed in the shading region B.

Then, as illustrated in FIG. 10 by (c), drawing is performed by irradiating ultraviolet rays or electron beams onto the entire surface of the resist 24 on the substrate 11 that is exposed in the shading region B (step S23). Then, similar to the above, the reflective photomask is developed and a resist 24b on the surface 11b of the substrate 11 within the shading region B is removed. Then, as illustrated in FIG. 11 by (a), a resist pattern 24a is formed on the absorption film 14 (step S24)

Then, using the resist pattern 24a as an etching mask, etching is performed (step S25). Thus, as illustrated in FIG. 11 by (b), the upper ends of the preliminary projections 1a are sharpened in the surface 11b of the substrate 11 that is exposed in the shading region B. The height H is also heightened. Thus, the plurality of projections 1 each having the sharpened apex 2 and the predetermined height H are formed in an approximately pyramidal shape. The positions of the apices 2 of the projections 1 in the illustration are different from the positions of the apices 2 of the projections 1 described above (see FIGS. 1, 2), but the positions of the apices 2 of the projections 1 may be appropriately modified as such.

Lastly, as illustrated in FIG. 11 by (c), the resist pattern 24a is removed from the reflective photomask (step S26), the reflective photomask is washed (step S27), the reflective photomask is dried (step S28), thereby forming the projections 1 in the area where the substrate 11 is exposed in the shading region B.

As at step S25, using the resist pattern 24a on the absorption film 14 as an etching mask, the areas other than the preliminary projections 1a can be protected from damage due to the etching when the projections 1 are formed.

The method for manufacturing the reflective photomask 10 according to the first embodiment is configured by steps S1 to S28 described above.

Example 1

Hereinafter is described Example 1 in which the method for manufacturing a reflective photomask is used. A reflective photomask blank includes the multilayer reflection film 12, the protective film 13 of Ru with a thickness of 2.5 nm, the absorption film 14 made of TaSi with a thickness of 70 nm, which are formed in this order on the substrate 11. The multilayer reflection film 12 is formed of 40 pairs of a Mo layer and a Si layer that are designed to provide a reflectance of about 64% for EUV light having a wavelength of 13.5 nm.

Firstly, on a surface of the reflective photomask blank 9, a chemically amplified positive resist (resist 21) (FEP 171: manufactured by FUJIFILM Electronic Materials Co., Ltd.) was applied with a thickness of 300 nm ((b) of FIG. 5: step S1). Then, the circuit pattern 15 and a pattern in the shading region B were drawn by an electron beam lithography machine (JBX 9000: manufactured by JEOL Ltd.) ((c) of FIG. 5: step S2). Then, PEB was performed at 110° C. for ten minutes, followed by spray development (SFG 3000: manufactured by Sigmameltec Ltd.), thereby forming the resist pattern 21a ((a) of FIG. 6: step S3).

Then, using a dry etching device, the absorption film 14 was etched using $CF_4$ plasma and $Cl_2$ plasma ((b) of FIG. 6: step S4). Then, the resist pattern 21a was separated from the reflective photomask ((c) of FIG. 6: step S5) and the surface of the reflective photomask was washed ((c) of FIG. 6: step S6) and dried ((c) of FIG. 6: step S7), thereby preparing a structure having the circuit pattern region A in the absorption film 14. In the circuit pattern region A, a plurality of circuit patterns 15 that were drawn in a 1:1 line and space pattern with a width of 200 nm were arranged in the center of the mask and the size of the circuit pattern region A was 10 cm×10 cm.

Then, an i-line resist (resist 22) was applied onto the absorption film 14 with a film thickness of 500 nm ((a) of FIG. 7: step S8). Then, the pattern of the shading region B was drawn over the coating by using an i-line lithography machine (ALTA 3000: manufactured by Applied Materials Inc.) ((b) of FIG. 7: step S9), followed by development ((c) of FIG. 7: step S10). Thus, the resist pattern 22a with an opening region in an approximately rectangular shape for serving as the shading region B later was formed on the absorption film 14. In this case, the resist pattern 22a had an opening width of 5 mm and the approximately rectangular resist pattern 22a was arranged at a position spaced by 3 μm from the 10 cm×10 cm circuit pattern region A in the central portion of the mask.

Then, vertical dry etching was performed using $CHF_3$ plasma in the following conditions to selectively remove the absorption film 14, the protective film 13 and the multilayer reflection film 12 in the opening of the resist pattern 22a ((a) of FIG. 8: step S11).

Pressure in the dry etching device: 6.665 Pa (50 mTorr)
Inductively coupled plasma (ICP) power: 500 W
Reactive ion etching (ME) power: 2000 W
Flow rate of $CHF_3$: $3.38 \times 10^{-2}$ Pa·m$^3$/s (20 sccm)
Processing time: six minutes Then, the resist pattern 22a was separated from the reflective photomask ((b) of FIG. 8: step S12), the reflective photomask was washed ((b) of FIG. 8: step S13), the reflective photomask was dried ((b) of FIG. 8: step S14), thereby forming the shading region B in the reflective photomask.

Then, over the entire surface of the reflective photomask, a chemically amplified positive resist (resist 23) (FEP 171:

manufactured by FUJIFILM Electronic Materials Co., Ltd.) was applied with a film thickness of 300 nm ((c) of FIG. 8: S15). Then, drawing in dot pattern arrangement was performed over the resist 23 in the area where the substrate 11 was exposed in the shading region B, by using an electron beam lithography machine (JBX 9000: manufactured by JEOL Ltd.) ((a) of FIG. 9: step S16). Then, by performing PEB at 110° C. for ten minutes and spray development (SFG 3000: manufactured by Sigmameltec Ltd.), the resist dot pattern 23a was formed in the area of the resist 23 on the substrate 11 ((b) of FIG. 9: step S17).

Then, using the dry etching device, etching was carried out using $CF_4$ plasma and $Cl_2$ plasma ((c) of FIG. 9: step S18) and the preliminary projections 1a were formed on the surface 11b of the substrate 11 that is exposed in the shading region B. Then, the resist 23 and the resist dot pattern 23a were separated from the reflective photomask ((a) of FIG. 10: step S19), the reflective photomask was washed ((a) of FIG. 10: step S20), and the reflective photomask was dried ((a) of FIG. 10: step S21).

Then, over the entire surface of the reflective photomask, an i-line resist (resist 24) was applied with a film thickness of 500 nm ((b) of FIG. 10: step S22). Drawing was carried out using an i-line lithography machine (ALTA 3000: manufactured by Applied Materials Inc.) over the area of the resist 24 on the substrate 11 that is exposed in the shading region B ((c) of FIG. 10: step S23) for exposure. The resultant photomask was developed, similar to the above, and the resist 24b on the substrate 11 in the shading region B was removed to form the resist pattern 24a ((a) of FIG. 11: step S24).

Then, etching was performed using the resist pattern 24a as an etching mask ((b) of FIG. 11: step S25). Then, the resist pattern 24a was removed from the reflective photomask ((c) of FIG. 11: step S26), the reflective photomask was washed ((c) of FIG. 11: step S27), and the reflective photomask was dried ((c) of FIG. 11: step S28).

Through the steps S1 to S28, the reflective photomask 10 according to the first embodiment was obtained.

(Experiment 1: Presence/Absence of Projection)

Then, the reflective photomask 10 manufactured as described above was subjected to Experiment 1 where light was irradiated with varied wavelengths using an optical film thickness gauge to calculate the reflectance. The results of the experiment are shown in FIG. 12.

Figure 12:
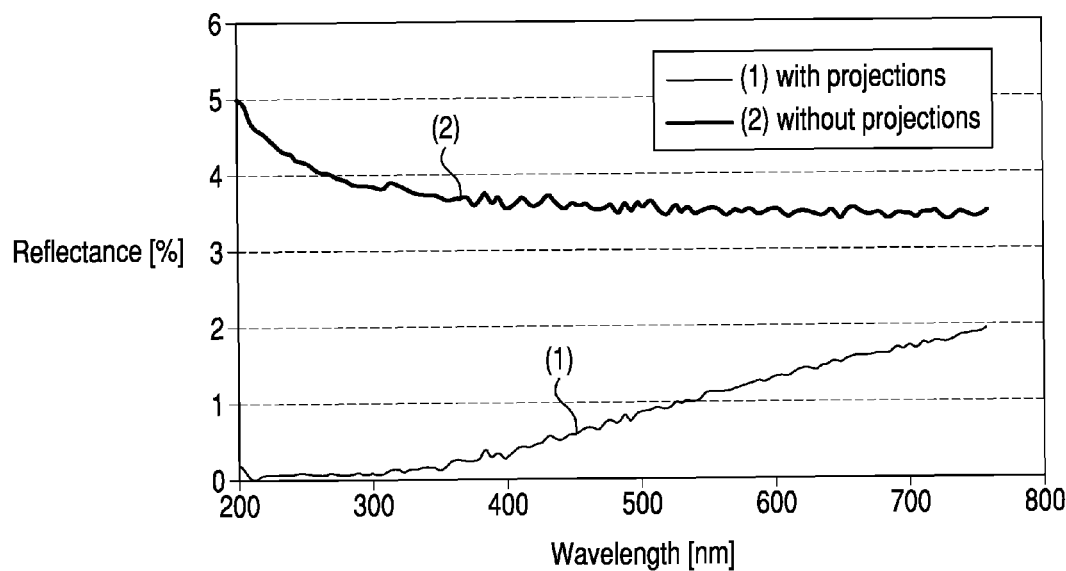
FIG. 12 is a graph illustrating reflectance of the reflective photomask according to the first embodiment in comparison with a conventional reflective photomask.

In FIG. 12, (1) indicates the reflective photomask 10 according to the first embodiment manufactured as described above and (2) indicates a reflective photomask having the shading region B but not having the projections 1 formed on the surface of the substrate 11 exposed in the shading region B. The projections 1 of the reflective photomask of (1) were in an approximately pyramidal shape.

From FIG. 12, the reflective photomask 10 according to the first embodiment was found to suppress reflection more, with any wavelength, than the conventional reflective photomask without the projections 1 for light. Particularly for the light with a wavelength from 200 nm to 300 nm, the reflectance by the conventional reflective photomask was approximately from 4% to 5%, whereas the reflectance by a reflective mask 100 fabricated in Example 1 was maximally 0.15%. Accordingly, the first embodiment was found to be particularly effective for the out-of-band light in this wavelength range.

(Experiment 2: Aspect Ratio and Height of Projections)

Then, reflective photomasks 10 formed with projections 1 of various heights H were prepared using the above manufacturing method to perform Experiment 2. In Experiment 2, light with a different wavelength was permitted to be incident on the photomasks to measure reflectance. Experiment 2 was performed to derive an optimum aspect ratio (ratio of the height H to the pitch P between the projections 1) and the height H in the configuration of the projections 1 according to the present embodiment. The results of the experiment are shown in FIG. 13.

The reflective photomask 10 was configured as described in Example 1 except for the height H. The projections 1 were in an approximately pyramidal shape and the concave-and-convex pattern C was a dot pattern. As the out-of-band light, three types of incident light with a wavelength $\lambda$=195 nm, 300 nm, and 400 nm were used. When the light with each wavelength $\lambda$ was incident on the shading region B at an incident angle of five degrees, the height H of the projections 1 was varied between 0 and 400 nm to measure the reflectance. This brought the following findings.

(1) Aspect Ratio

Figure 13:
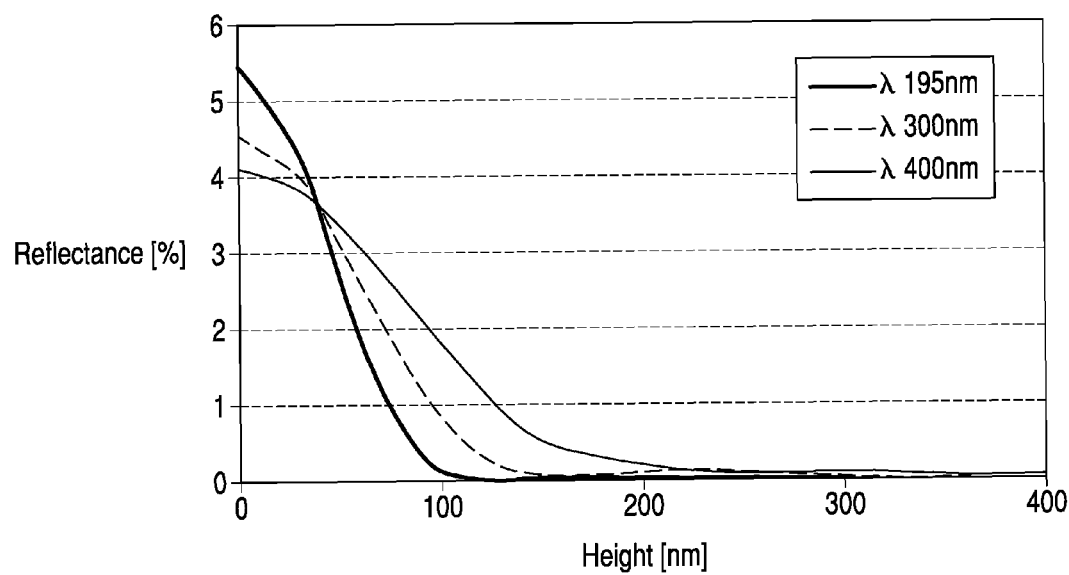
FIG. 13 is a graph illustrating reflectance of the reflective photomask according to the first embodiment when a wavelength of out-of-band light and a height of projections are changed.

As illustrated in FIG. 13, when the pitch P is 150 nm and the aspect ratio is 0.1 (height H=15 nm in Experiment 2), reflectance of the out-of-band light with each wavelength was decreased compared to that in the case of not forming the projections 1 (height H=0 nm in Experiment 2). Accordingly, the configuration with the aspect ratio of 0.1 or more can provide an effect of antireflection.

With the aspect ratio of 0.5 (height H=75 nm in Experiment 2) or more, reflectance of the out-of-band light with each wavelength is approximately 3% or less, and more favorable reflective photomask 10 can be obtained.

With the aspect ratio of 1.0 (height H=150 nm in Experiment 2) or more, reflectance of the out-of-band light with each wavelength is approximately 0.5% or less, and the even more favorable reflective photomask 10 can be obtained.

With the aspect ratio of 1.5 (height H=225 nm in Experiment 2) or more, reflectance of the out-of-band light with each wavelength is approximately 0.1% or less, and the even more favorable reflective photomask 10 can be obtained.

(2) Height

As illustrated in FIG. 13, when the height H is half of each wavelength of the incident out-of-band light, all of the reflectance is 0.5% or less. Accordingly, the configuration with the height H of half the wavelength of the incident out-of-band light can provide a favorable reflective photomask 10.

(Advantageous Effects of First Embodiment)

According to the reflective photomask 10 of the first embodiment, in the shading region B, the plurality of projections 1 are formed at the pitch P shorter than 800 nm in the interface between the vacuum, which is the incident side of the exposure light, and the substrate 11, thereby forming the fine concave-and-convex pattern C on the surface 11b of the substrate 11. Of the out-of-band light emitted together with the exposure light, the out-of-band light with a wavelength longer than the pitch of the projections 1 is prevented from diffracting. Further, reflection of such out-of-band light is minimized on the front surface that is the incident side of the substrate 11, but not on the rear surface.

Thus, according to the reflective photomask 10 of the first embodiment having a shading region B that reduces the influence of the projection effect, reflection of the out-of-band light is minimized more than in conventional art, the out-of-band light being emitted together with exposure light and irradiated to the wafer that is an object of exposure. When chips are mounted on the surfaces of a wafer in a multifaceted manner, multiple exposures caused not only by EUV light but also out-of-band light are effectively minimized in the boundary region between the chips. Further, a circuit pattern with high accuracy can be transferred onto the wafer, while the throughput can be improved. The similar advantageous effects are obtained in a reflective photomask in which a shading region is firstly formed and then the circuit pattern region A is formed.

The projections 1 formed in an approximately pyramidal shape according to the first embodiment have a volume ratio between the substrate side and the vacuum side which smoothly varies in the direction of the height of projections. Thus, the distance between the adjacent projections is not a single value but provided with a range. That is, not one but several wavelengths can be applied to the out-of-band light. When incident light has wavelengths in a relatively wide range and has different incident angles, the reflection of out-of-band light can be further minimized.

The method for manufacturing a reflective photomask according to the first embodiment can provide a favorable reflective photomask 10 in EUV photolithography. The reflective photomask 10 is formed with the projections 1 at the pitch P shorter than 800 nm in the area where the substrate 11 is exposed in the shading region B. Accordingly, the reflection of the out-of-band light can be minimized, and thus multiple exposures can be minimized in the boundary region between chips on the wafer.

Since the concave-and-convex pattern C according to the present embodiment has the plurality of projections 1 that are formed in dense arrangement without exposing the flat upper surface 11b of the substrate, there is no flat area in the region of the concave-and-convex pattern C. Thus, the out-of-band light is not reflected by a flat area, which minimizes the reflection of the out-of-band light.

(Other Matters According to First Embodiment)

The pitch P between the projections 1 can effectively minimize diffraction of light, as long as the pitch P is shorter than the wavelength of the target light as in the first embodiment. Accordingly, the pitch does not have to be reduced more than necessary. For example, when the target is the out-of-band light with all wavelengths from about 140 nm to 800 nm, the pitch P may be smaller than 70 nm, which is a half of the minimum wavelength of 140 nm (e.g. 60 nm) and is not required to be reduced down to 10 nm or 20 nm. By setting the pitch P in this way and forming the projections 1 with the set pitch, productivity of the photomask can be enhanced.

The pitch P is not limited to a fixed value as in the first embodiment but may be set variously. For example, the pitch may be various in series, such as 350 nm, 300 nm, 250 nm, and 200 nm. This setting contributes to minimizing reflection of out-of-band light in the wavelength range conforming to each pitch P.

The shape of the projections 1 is not limited to the shape described in the first embodiment. Another shape, such as conical, semi-spherical, and trapezoidal shape, may be used as long as the shape gives a level difference to the surface 11b of the substrate 11 and smoothly varies the volume ratio between the substrate 11 side and the vacuum side towards the substrate 11 side, in the direction of the height of the projections 1.

In the manufacturing method according to the first embodiment, after the circuit pattern region A is formed in the absorption film 14, the shading region B is formed on the outer peripheral side of the circuit pattern region A, and then the projections 1 are further formed on the area where the substrate 11 is exposed in the shading region B. However, the shading region B may be firstly formed and then the projections 1 may be formed in the area where the substrate 11 is exposed in the shading region B, and then the circuit pattern region A may be formed on the absorption film 14. That is, the reflective photomask blank 9 may be prepared firstly, and then the circuit pattern region A may be formed to provide the reflective photomask 10. Thus, the circuit pattern 15 can be protected from damage caused by the etching gas or the like when forming the projections 1 by the etching.

Hereinafter, the second to fourth embodiments will be described. The second to fourth embodiments are different in the shape of the projections 1 from the first embodiment but are same in the rest of the configuration. In the description below, description is focused on the projections 1 and the advantageous effects thereof, and the descriptions for the rest of the configuration are omitted.

Second Embodiment

Figure 14:
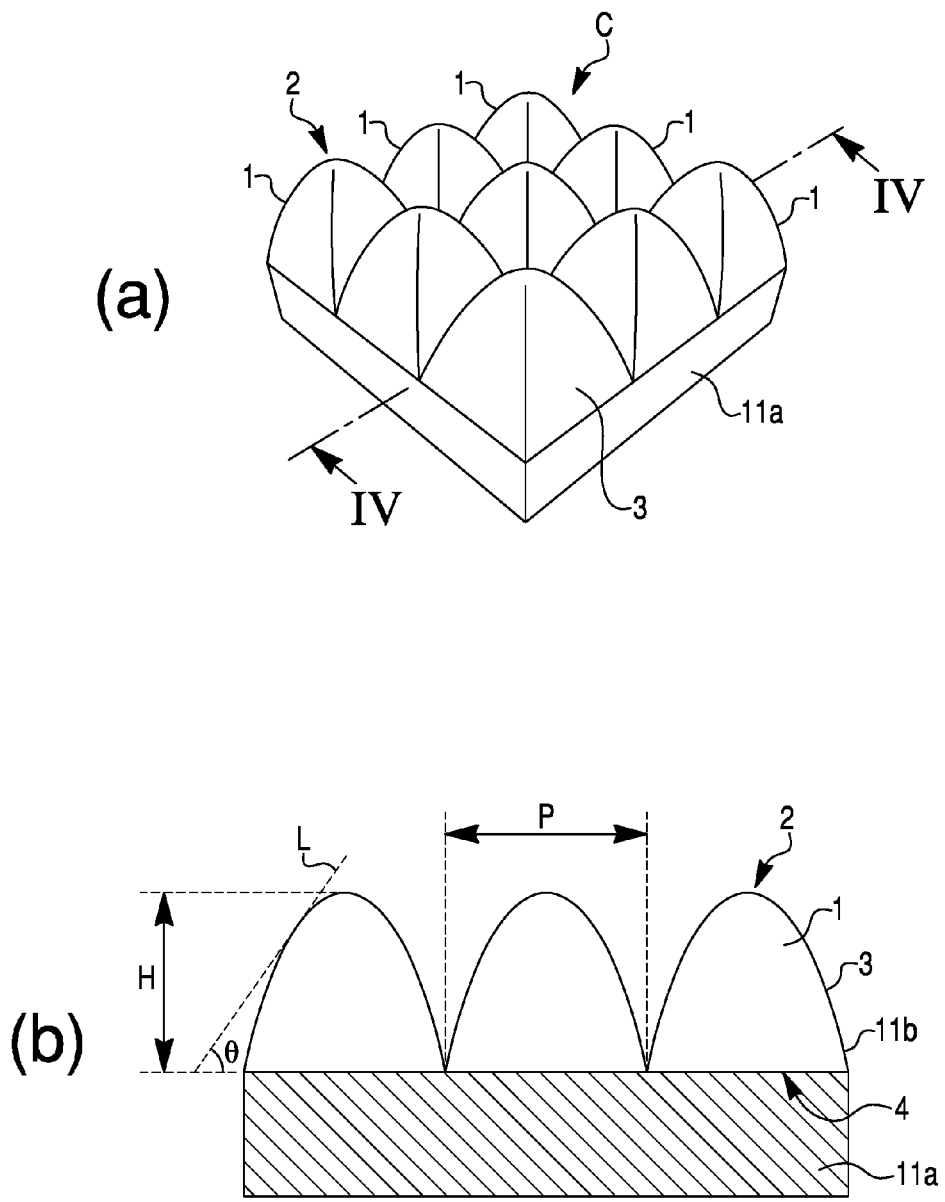
FIG. 14 shows diagrams each illustrating projections of a reflective photomask according to a second embodiment.

Firstly, with reference to FIG. 14, a reflective photomask according to the second embodiment is described. FIG. 14 shows by (a) a schematic perspective view illustrating part of a plurality of arrayed projections 1, and FIG. 14 shows by (b) a cross-sectional view taken along the line IV-IV of (a).

As illustrated in FIG. 14 by (a) and (b), the projections 1 each have an approximately bell shape as a whole, have an apex 2 in a curved convex shape, while having a side face 3 in an upwardly convex parabolic shape in a cross-sectional view. That is, outer surface of each projection 1 that is configured with the apex 2 and the side face 3 is configured to be a curved surface. Thus, each projection 1 has the side face 3 that is configured to have an angle relative to the bottom face 4, the angle being provided not with a single value but with a range. Specifically, in (b) of FIG. 14, an angle θ between a tangent L and the horizontal plane varies in a range of approximately 90 degrees to 0 degrees. In this case, the tangent L passes one optional point on the upwardly convex parabolic shape that configures the side faces 3. Thus, an incident plane over which the out-of-band light is incident on the substrate 11 can have a plurality of angles.

Accordingly, the reflective photomask 10 according to the second embodiment is provided with the projections 1 of the configuration described above. Thus, in addition to the advantageous effects described in the first embodiment, reflection can be minimized when the incident out-of-band light has wavelengths in a relatively wide range. In addition, when the out-of-band light has different incident angles (five degrees, seven degrees, etc.), reflection can be minimized. With the increased range of applicable wavelengths of the out-of-band light, reflection of out-of-band light is reduced and thus a favorable reflective photomask 10 can be provided.

When a curved surface is formed in the side face 3 as in the second embodiment, the shape in a cross-sectional view may be appropriately selected from, a sine curve, hyperbolic curve, arc, or the like, other than the parabolic shape.

Third Embodiment

Referring to FIG. 15, a reflective photomask according to the third embodiment is described. FIG. 15 shows by (a) a schematic perspective view illustrating part of a plurality of projections 1 that are provided in parallel, and FIG. 15 shows by (b) a cross-sectional view taken along the V-V line of (a).

As illustrated in FIG. 15, the projections 1 according to the third embodiment are provided as ridges each having a convex apex 2 and a fixed height. The projections 1 as ridges are parallelly provided at a constant pitch P. As illustrated in FIG. 15 by (b), the projections 1 are each in an approximate sine curve in a cross-sectional view, forming a valley 5 between the adjacent projections 1, the valley 5 being defined by the side faces 3 of the adjacent projections 1. The valleys 5 are regions defined by the side faces 3 and the apices 2 of the projections 1.

The projections 1 according to the third embodiment are in a ridge shape but not in the projected shape as in the first and second embodiments. The fine concave-and-convex pattern C formed in the surface 11b of the substrate 11 is thus in a line and space pattern not in a dot pattern. When projections 1 in this shape are formed using the lithography technique and the etching technique, for example, the projections 1, the number of patterns to be drawn is less than that of a dot pattern, which reduces pattern drawing time compared with that for a dot pattern. Thus, the reflective photomask 10 according to the present embodiment has better productivity compared with the first and second embodiments.

When the projections 1 in a ridge shape are formed as in the third embodiment, the shape of each of the projections 1 in a cross-sectional view may be appropriately selected from a parabolic shape, a hyperbolic curve, an arc, or the like, other than the sine curve.

Fourth Embodiment

Referring to FIG. 16, the reflective photomask 10 according to a fourth embodiment is will be described. FIG. 16 shows by (a) a schematic perspective view illustrating part of a plurality of arrayed projections 1, and FIG. 16 shows by (b) a cross-sectional view taken along the line VI-VI of (a).

As illustrated in FIG. 16, the projections 1 according to the fourth embodiment are in a ridge shape each having a sharp-tip apex 2 and a fixed height. The projections 1 are provided parallelly formed at a constant pitch P. In the direction perpendicular to the projections 1, a plurality of projections 1 in the same shape are parallelly formed at the same pitch P in a similar manner. As a whole, mutually perpendicular ridgelines of the apices 2 of the plurality of projections 1 are arranged in lattice form in a planar view (not shown) to configure recesses 6 each having an inverted pyramidal shape (see (a) of FIG. 16).

As illustrated in FIG. 16 by (b), the projections 1 are each in an approximately equilateral triangular shape in a cross-sectional view. Each recess 6 is formed so as to be enclosed by the side faces 3 of four projections 1 that are on the respective four lateral sides of the recess.

In this way, the projections 1 according to the fourth embodiment form the recesses 6 in the inverted pyramidal shape. Accordingly, the fine concave-and-convex pattern C formed on the surface 11b of the substrate 11 is not in a dot pattern but in a hole pattern.

(Experiment 3: Relationship Between Reflectance, Pitch P, and Height H)

Experiment 3 was conducted in which the reflective photomasks 10 according to the fourth embodiment were prepared. The photomasks 10 were provided with the projections 1 with various heights H and various pitches P. The light with a fixed wavelength was made incident on the photomasks 10 to measure the reflectance. Experiment 3 was conducted to review the relationship between the reflectance, the pitch P, and the height H in the configuration of the projections 1 according to the fourth embodiment. The results are shown in FIG. 17.

The out-of-band light that is incident on the reflective photomask 10 had a wavelength $\lambda$=195 nm, and three patterns of pitch P at 50 nm, 100 nm, and 150 nm were used. The above out-of-band light was incident on the shading region B at an incident angle of five degrees for each pitch P to measure the reflectance by varying the height H of the projections 1. This brought the following findings.

Figure 17:
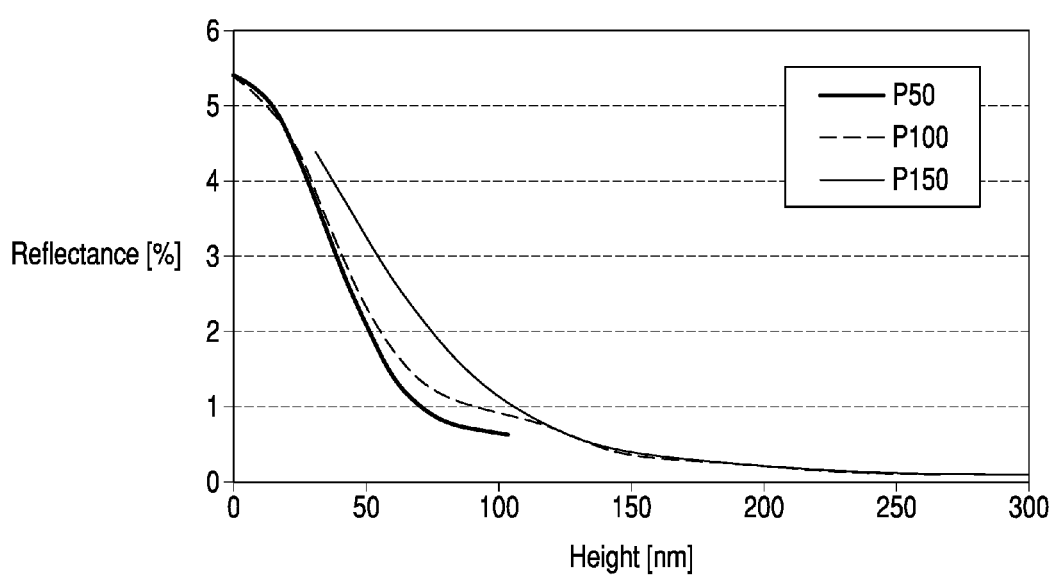
FIG. 17 is a graph illustrating relationship between reflectance and a height of the reflective photomask according to the fourth embodiment.

As illustrated in FIG. 17, with the same pitch P, the reflectance was decreased as the height H was increased. With the same height H, the reflectance was decreased as the pitch P became denser.

When the height H was a half (97.5 nm) of the wavelength of the incident light, all exhibited a reflectance of 1.5% or less. Accordingly, as described in "(2) Height" in the section (Aspect Ratio and Height H of Projections 1) of the first embodiment, the configuration with the height H being a half of the wavelength of the incident out-of-band light was found to provide a favorable reflective photomask 10.

The projections 1 of the reflective photomask 10 according to the fourth embodiment form a hole pattern having recesses each in an inverted pyramidal shape. Use of such projections 1 can make the manufacturing process relatively easy, and thus is suitable for mass production, if a mold formed with a fine convex pattern is used as in nanoimprinting, for example. Thus, the reflective photomask 10 according to the fourth embodiment has better productivity than in other embodiments.

When the plurality of projections 1 having the recesses 6 are formed as in the fourth embodiment, the shape each of the projections 1 in a cross-sectional view is not limited to the approximately triangular shape, but may be appropriately selected from a sine curve, a parabolic shape, a hyperbolic curve, an arc, and the like. For example, the projections 1 may be ridges each having a tip end in a curved convex shape and a cross section in an approximately sine curved shape (refer to the third embodiment) and the plurality of ridges may be arranged perpendicularly. With this configuration, cone shaped recesses 6 (see FIG. 21) can be formed.

The fine concave-and-convex pattern C in the first to fourth Embodiments described above has been in a dot pattern, a line and space pattern, and a hole pattern. However, the types of concave-and-convex pattern are not limited to them. For example, the projections 1 may be in an approximately rectangular parallelepiped shape to form a pillar pattern. In EUV lithography, any pattern may be used as far as the pattern provides a structure in which the plurality of projections 1 are formed at the pitch P shorter than the wavelength of the out-of-band light in the interface between the vacuum, as the light incident side, and the substrate 11, and a level difference is formed on the surface 11b of the substrate 11.

Hereinafter will be described the fifth to seventh embodiments associated with a method for manufacturing a reflective photomask.

In the manufacturing method described in the first embodiment above, after the substrate 11 is exposed in the shading region B firstly, the projections 1 are formed in the exposed area. However, in the manufacturing method according to the fifth to seventh embodiments, a step of forming the shading region B where the substrate 11 is exposed is integrally performed with a step of forming the plurality of projections 1 in the area where the substrate 11 is exposed are to thereby form the projections 1 simultaneously with the exposure of the substrate 11. The fifth to seventh embodiments are different from each other in the method of forming the projections 1.

Each of the fifth to seventh embodiments has the same configuration as that of the first embodiment, except for the method of forming the projections 1. Accordingly, the description below is mainly focused on the method of forming the projections 1 and the advantageous effects associated with the method, and the descriptions on the rest of the configuration are omitted.

Fifth Embodiment

Firstly, a method for manufacturing a reflective photomask according to the fifth embodiment is described by way of Example 2 that uses lithography and etching (see FIGS. 18 to 22) and Example 3 that uses nanoimprinting (see FIGS. 23 to 26).

In the fifth embodiment, firstly, the absorption film 14 is subjected to patterning to form a pattern that is the same as the concave-and-convex pattern C to be formed on the substrate 11 exposed in a shading region. The patterned region is taken as a concave-and-convex pattern region $B_0$. Then, the multilayer reflection film 12, the protective film 13, and the absorption film 14 are removed by etching to form the shading region B where the substrate 11 is exposed. In the etching, the concave-and-convex pattern region $B_0$ on the absorption film 14 is permitted to serve as an etching mask.

Figure 18:
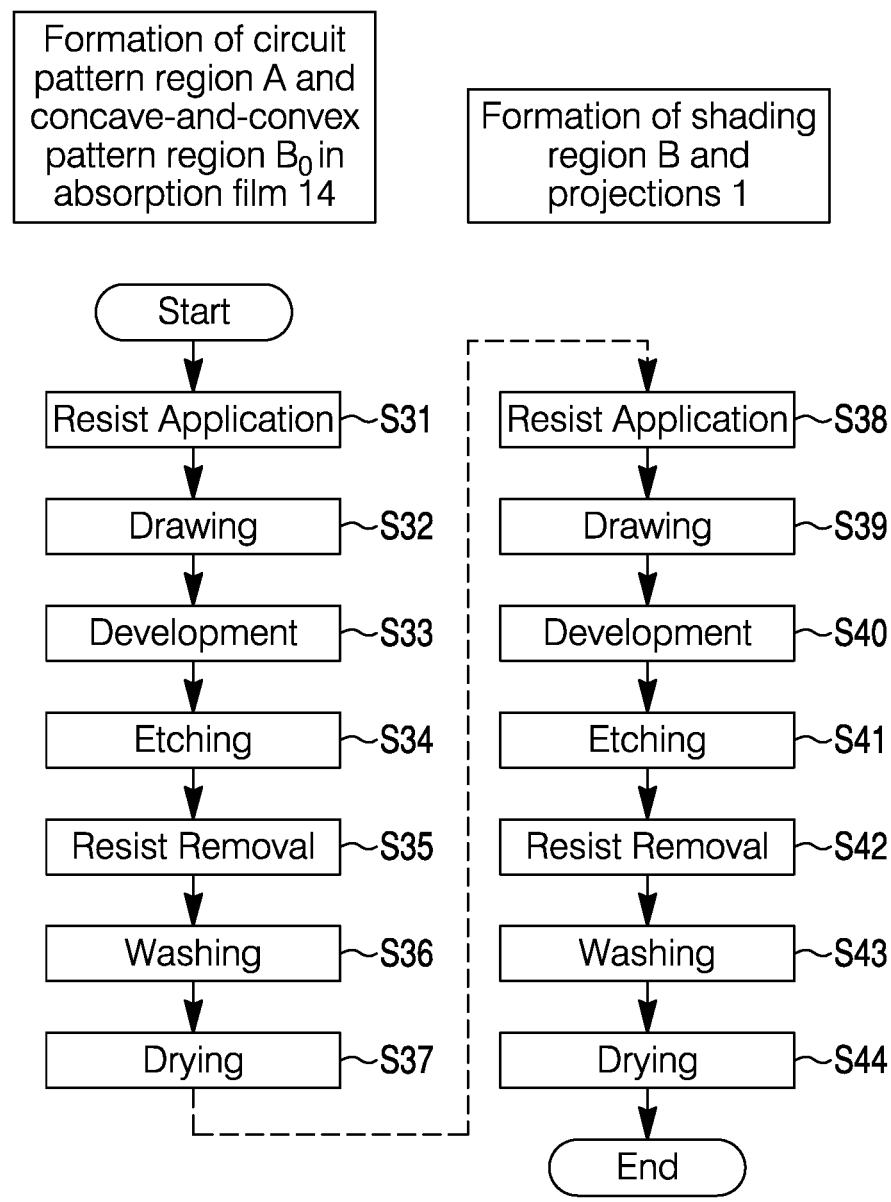
FIG. 18 is a flow chart illustrating a method for manufacturing a reflective photomask according to Example 2 of a fifth embodiment.
Figure 20:
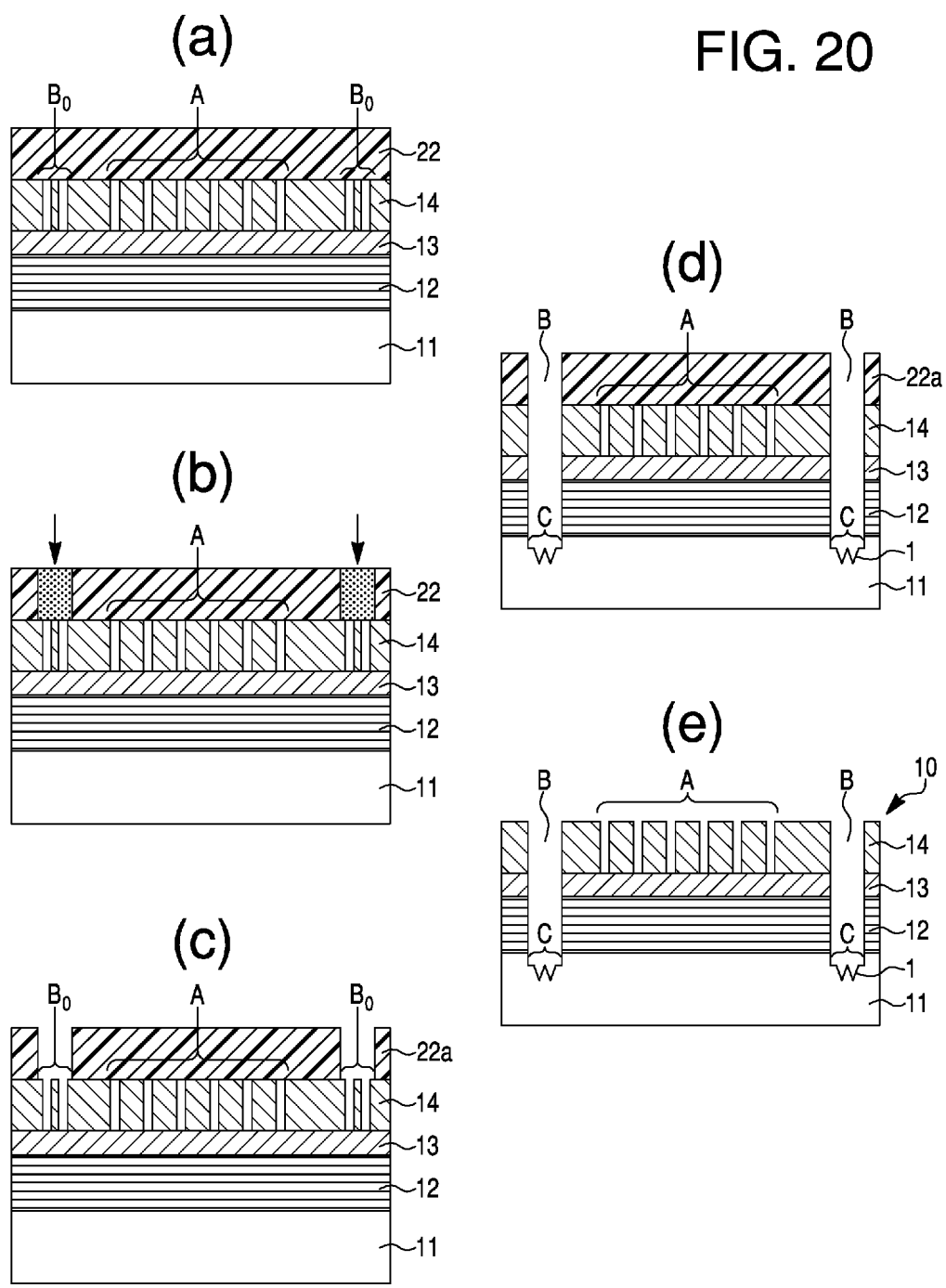
FIG. 20 shows cross-sectional views each illustrating the process of manufacturing a reflective photomask according to Example 2 of the fifth embodiment.

A specific manufacturing method will be described below. FIG. 18 illustrates a flow chart of the manufacturing process of Example 2 and FIGS. 19 to 20 illustrate cross sections of the reflective photomask in the manufacturing process of Example 2. The description for the manufacturing method of the fifth embodiment is started with the reflective photomask which is in a state of having been applied with the processing step S1 of Example 1 of the first embodiment (see (b) of FIG. 5). This state is illustrated in FIG. 19 by (a).

Example 2

Firstly, on a surface of a reflective mask blank, a chemically amplified positive resist (resist 21) (FEP 171: produced by FUJIFILM Electronic Materials Co., Ltd.) was applied with a film thickness of 300 nm ((a) of FIG. 19: S31).

Then, on the resist 21, the circuit pattern 15 and a concave-and-convex pattern to form the projections 1 were drawn by an electron beam lithography machine (JBX 9000: manufactured by JEOL Ltd.), not shown ((b) of FIG. 19: S32). After that, PEB at 110° C. for ten minutes and spray development (SFG 3000: manufactured by Sigmameltec Ltd.) were performed to form the resist pattern 21a ((c) of FIG. 19: S33).

Then, using a dry etching device (not shown), the absorption film 14 was etched with $CF_4$ plasma and $Cl_2$ plasma ((d) of FIG. 19: S34). Then, the resist pattern 21a was separated from the reflective photomask (S35) and the reflective photomask was washed ((e) of FIG. 19: S36), and the reflective photomask was dried (S37).

Through the above steps, the circuit pattern region A and the concave-and-convex pattern region $B_0$ were formed on the absorption film 14 ((e) of FIG. 19).

In the circuit pattern region A, several patterns 15 that were drawn in a 1:1 line and space pattern with a width of 200 nm were arranged in the center of the mask. The size of the circuit pattern region A was 10 cm×10 cm. The concave-and-convex pattern region $B_0$ was in a hole pattern with a height H of 70 nm and a pattern pitch of 320 nm.

Then, the reflective photomask was subjected to a step of forming the shading region B and the projections 1.

An i-line resist (resist 22) was applied onto the absorption film 14 with a film thickness of 500 nm ((a) of FIG. 20: S38), and subsequently the pattern of the shading region B was drawn using an i-line lithography machine (ALTA 3000: manufactured by Applied Materials Inc.) ((b) of FIG. 20: S39), followed by development ((c) of FIG. 20: S40). Thus, the resist pattern 22a with an opening of an approximately rectangular region that is the same as the shading region B was formed. In this case, the resist pattern 22a had the opening width of 3 mm, and the resist pattern 22a was arranged in a position spaced by 3 µm away from the 10 cm×10 cm circuit pattern region A in the center portion of the mask.

Then, vertical dry etching using $CHF_3$ plasma was performed in the following conditions (step S41) to selectively remove the absorption film 14, the protective film 13 and the multilayer reflection film 12 in the opening of the resist pattern 22a ((d) of FIG. 20). Thus, the projections 1 were formed, with the upper ends being sharpened to thereby form the concave-and-convex pattern C.

Pressure in the dry etching device: 6.665 Pa (50 mTorr)
Inductively coupled plasma (ICP) power: 500 W
Reactive ion etching (ME) power: 2000 W
Flow rate of $CHF_3$: $3.38 \times 10^{-2}$ Pa·m³/s (20 sccm)
Processing time: six minutes In this way, the step of forming the shading region B where the substrate 11 is exposed was integrally performed with the step of forming the plurality of projections 1 in the area where the substrate 11 is exposed, thereby forming the projections 1 simultaneously with the exposure of the substrate 11.

Then, the resist pattern 22a was separated from the reflective photomask (S42), the reflective photomask was washed (S43), and the reflective photomask was dried (S44) to obtain the reflective photomask 10 (see (e) of FIG. 20). Although only one projection 1 is illustrated in (e) of FIG. 20, the number is not actually limited to one.

The method for manufacturing the reflective photomask 10 according to the fifth embodiment is configured by steps S31 to S44 described above.

FIG. 21 illustrates by (a) a top view as a planar view of the reflective photomask 10 that was fabricated in Example 2, and FIG. 21 illustrates by (b) a cross-sectional profile of the same. As illustrated in FIG. 21 by (a), the concave-and-convex pattern C is in a mortar shape. As illustrated in FIG. 21 by (b), the projections 1 had an average pitch=approximately 320 nm, an average height H=50 nm, and an aspect ratio=0.16.

Figure 22A:
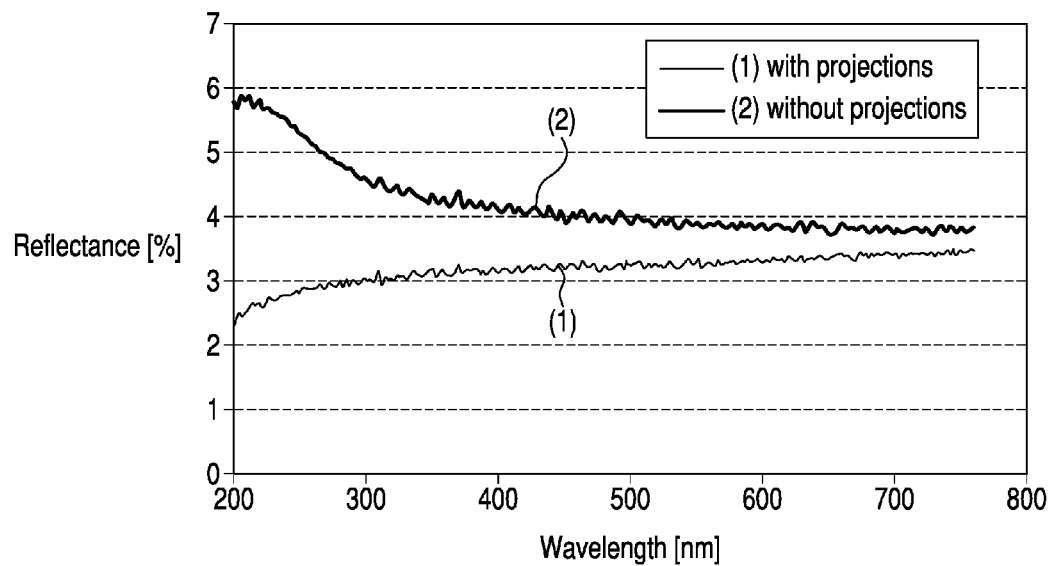
FIG. 22A is a graph illustrating relationship between reflectance and a wavelength of the reflective photomask according to Example 2 of the fifth embodiment.

FIG. 22A shows the results of measuring the reflectance of the out-of-band light using the reflective photomask 10 of Example 2. With a wavelength of 200 nm, the reflectance of the reflective photomask without the projections 1 ((2) of FIG. 22A) was approximately 5.95%, whereas the reflectance of the reflective photomask of Example 2 having the projections 1 ((1) of FIG. 22A) was 2.37%. With the wavelength of 200 nm, the reflectance of the reflective photomask having the projections 1 with an average pitch P of approximately 320 nm was reduced to roughly ⅖ of the reflectance of the reflective photomask without the projections 1. As illustrated in FIG. 22A, over the entire wavelength range of the out-of-band light of not more than 800 nm, the reflectance of the reflective photomask having the projections 1 was lower than the reflectance of the reflective photomask without the projections 1.

Figure 22B:
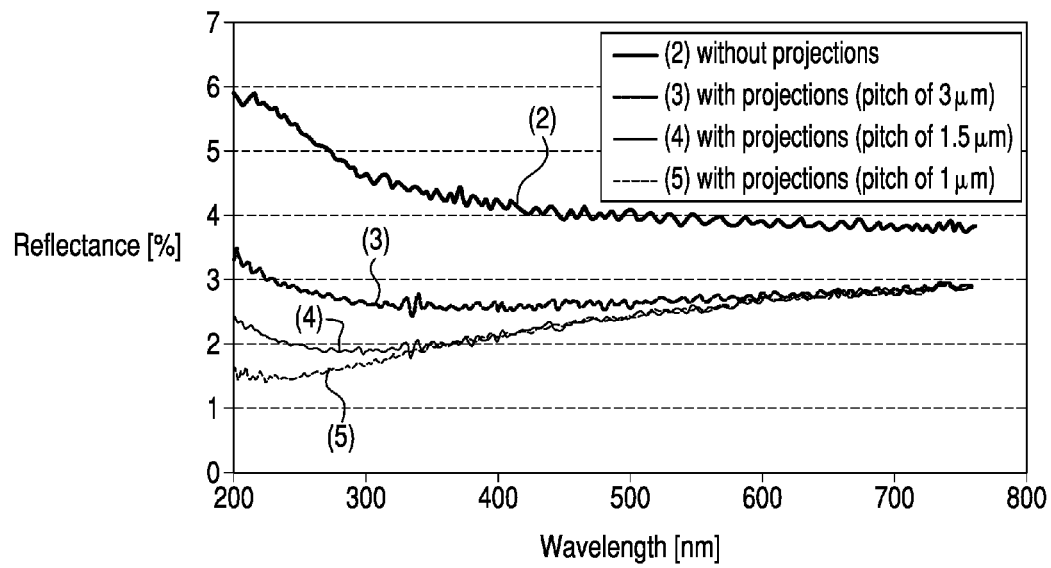
FIG. 22B is a graph illustrating relationship between reflectance and a wavelength of reflective photomasks with varied pitch of projections.

FIG. 22B illustrates the results of measuring the reflectance of the out-of-band light using the reflective photomask with varied pitches of the projections 1. The concave-andconvex pattern C was in a mortar shape, and the projections were imparted with three average pitches 1 μm, 1.5 μm, and 3 μm. The average height was 50 nm similar to the projections of FIG. 22A. The reflective photomask without projections was the same as the one in the case of FIG. 22A.

With a wavelength of 200 nm, the reflectance of the reflective photomask without projections ((2) of FIG. 22B) was approximately 5.95% similar to the case of FIG. 22A, whereas the reflectance of the reflective photomask having projections with an average pitch of 3 μm ((3) of FIG. 22B) was 3.32%. The reflectance of the reflective photomask having the projections 1 with an average pitch of 1.5 μm ((4) of FIG. 22B) was 2.28%. The reflectance of the reflective photomask having the projections 1 with an average pitch of 1 μm ((5) of FIG. 22B) was 1.42%. With the wavelength of 200 nm, in the case of varying the average pitch P in three patterns of 1 μm, 1.5 μm, and 3 μm, the reflectance of the reflective photomask having projections greatly lower than the reflectance of the reflective photomask without projections. As illustrated in FIG. 22B, over the entire wavelength range of the out-of-band light of not more than 800 nm, the reflectance of the reflective photomask having the projections was lower than the reflectance of the reflective photomask without the projections.

Example 3

Figure 23:
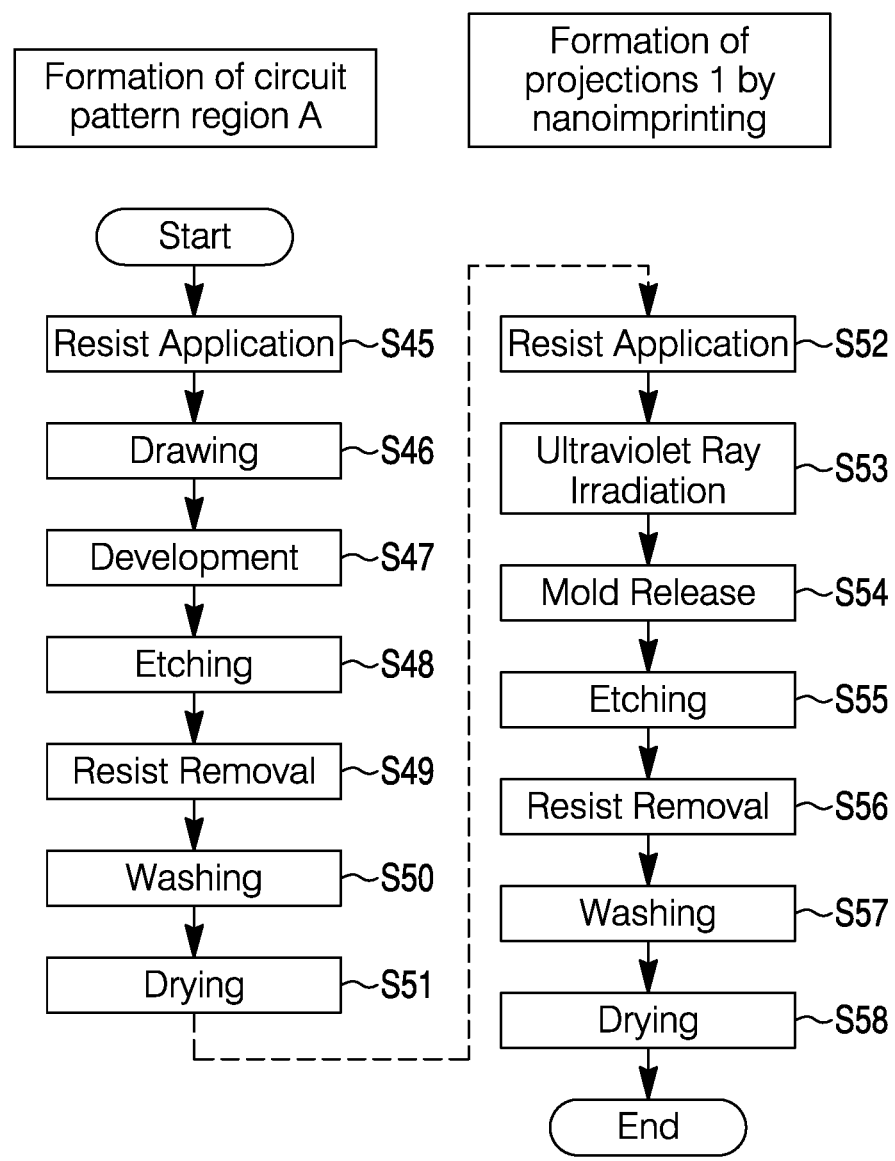
FIG. 23 is a flow chart illustrating a method for manufacturing a reflective photomask according to Example 3 of the fifth embodiment.
Figure 25:
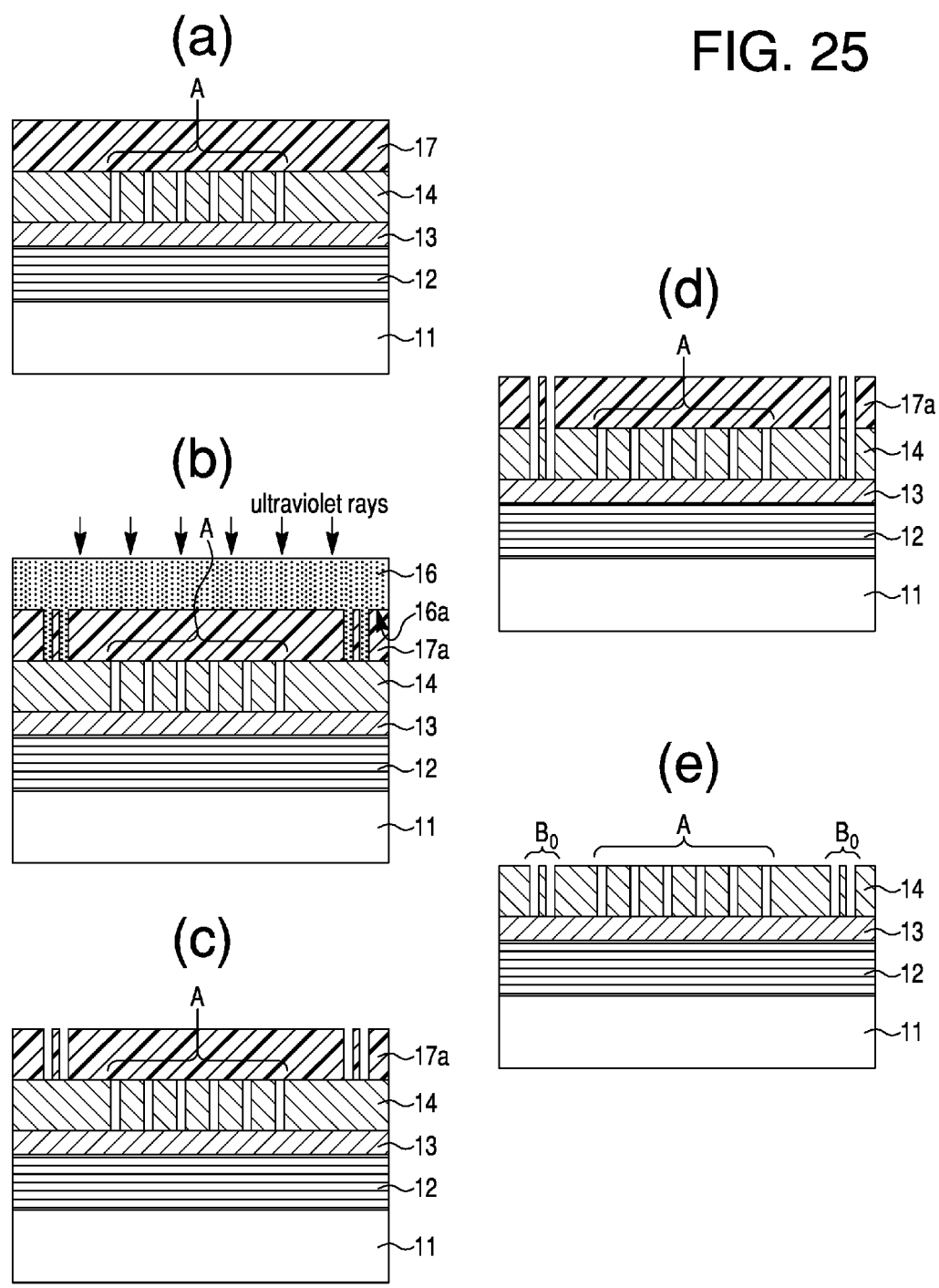
FIG. 25 shows cross-sectional views each illustrating the process of manufacturing the reflective photomask according to Example 3 of the fifth embodiment.
Figure 26:
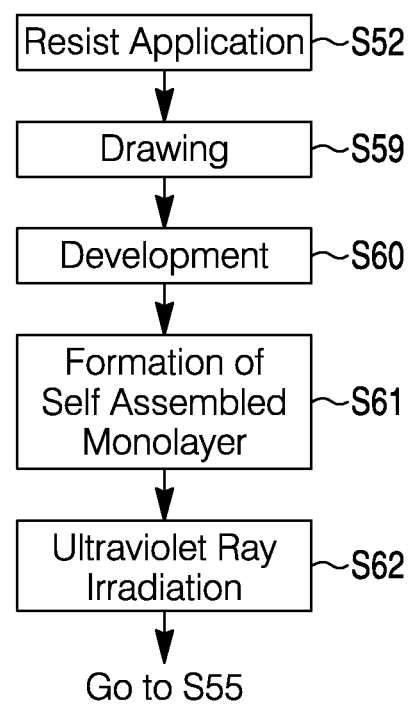
FIG. 26 is a flow chart illustrating a method for manufacturing a reflective photomask according to a sixth embodiment.

Example 3 will be described. FIG. 23 illustrates a flow chart of the manufacturing process of Example 3 and FIGS. 24 to 26 illustrate cross sections of a reflective photomask in the course of manufacture of Example 3.

Firstly, a method of forming the concave-and-convex pattern region $B_0$ in the absorption film 14 by nanoimprinting will be described. The description is started with the reflective photomask which is in a state of having been applied with the processing step S1 of Example 1 of the first embodiment (see (b) of FIG. 5). FIG. 24 illustrates by (a) this state.

Figure 24:
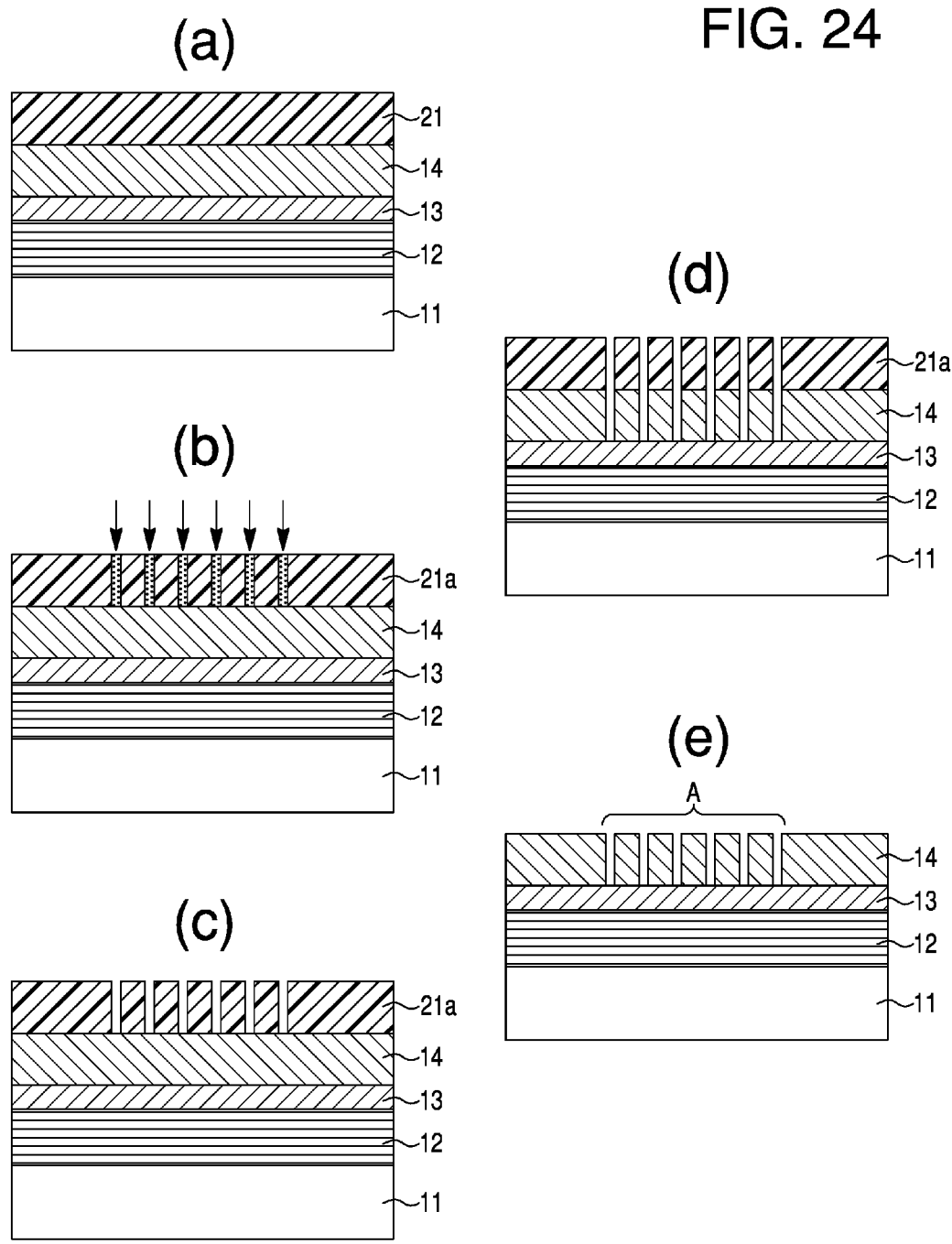
FIG. 24 shows cross-sectional views each illustrating a process of manufacturing a reflective photomask according to Example 3 of the fifth embodiment.

A chemically amplified positive resist (resist 21) (FEP171: produced by FUJIFILM Electronic Materials Co., Ltd.) was applied onto a surface of the reflective photomask, with a film thickness of 300 nm ((a) of FIG. 24: S45). Then, after the circuit pattern 15 was drawn on the resist 21 by an electron beam lithography machine, not shown, (JBX 9000: manufactured by JEOL Ltd.) ((b) of FIG. 24: S46), PEB at 110° C. for ten minutes and spray development (SFG 3000: manufactured by Sigmameltec Ltd.) were performed to form the resist pattern 21a ((c) of FIG. 24: S47).

Then, the absorption film 14 was etched with $CF_4$ plasma and $Cl_2$ plasma using a dry etching device ((d) of FIG. 24: S48). Then, the resist pattern 21a was separated from the reflective photomask (S49), the reflective photomask was washed (S50), and the reflective photomask was dried (S51) ((e) of FIG. 24). In the circuit pattern region A, a 1:1 line and space pattern with a width of 200 nm was formed and arranged in the center of the mask. The size of the pattern region was 10 cm×10 cm.

Then, an imprinting mold 16 having a dot pattern with a height H of 50 nm was prepared. The dot pattern was formed on a pattern surface 16a of the imprinting mold 16. The imprinting mold 16 was configured such that the pattern surface 16a will face the position of the concave-and-convex pattern region $B_0$ when the pattern surface 16a was overlapped with the upper surface of the absorption film 14 of the reflective photomask.

Then, to perform photo-imprinting using a photo-imprinting device (not shown), a photocurable resist (resist 17) (PAK-01 produced by Toyo Gosei Co., Ltd.) was applied onto the absorption film 14 of the reflective photomask that had been processed through the steps up to step S51, with a film thickness of 300 nm ((a) of FIG. 25: S52). At this point, a fluorine based surface treatment agent EGC-1720 (Sumitomo 3M Ltd.) as a mold-releasing agent was applied in advance onto the pattern surface 16a of the imprinting mold 16.

Then, the pattern surface 16a of the imprinting mold 16 was overlapped on the absorption film 14 and pressed at room temperature (pressing force: 1 MPa) and brought to a pressure-bonded state. In addition, 40 mJ of ultraviolet rays with a wavelength of 300 nm to 400 nm was irradiated to the rear surface of the imprinting mold 16 (upper side in (b) of FIG. 25) ((b) of FIG. 25: S53) to cure the resist 17.

Then, the imprinting mold 16 was released from the reflective photomask ((c) of FIG. 25: S54). Thus, the resist dot pattern 17a was formed, with the dot pattern of the imprinting mold 16 being transferred thereto.

Then, using a dry etching device, the absorption film 14 was etched by ME (reactive ion etching using a fluorine or chlorine based gas) ((d) of FIG. 25: S55). The resist dot pattern 17a was then separated from the reflective photomask (S56), the reflective photomask was washed (S57), and the reflective photomask was dried (S58) ((e) of FIG. 25). Thus, the concave-and-convex pattern region $B_0$ having a hole pattern with a height H of 50 nm was formed on the absorption film 14.

By forming the concave-and-convex pattern region $B_0$ on the absorption film 14, areas with and without the remnant absorption film 14 were formed. Thus, when etching using an etching gas is started in the shading region B at a later stage, etching start positions will be different between the areas with and without the remnant absorption film 14. Accordingly, the time taken for the etching gas to reach the substrate 11 will be different between these areas. Such a way of etching enables formation of the projections 1 in which a level difference is imparted to the surface 11b of the substrate 11. Such a way of etching also enables adjustment of the height H of the projections 1 and formation of the projections 1 with the diameter being increased from the absorption film 14 side toward the substrate 11.

The reflective photomask obtained through the steps up to S58 is the same as the reflective photomask obtained through the steps up to S37 in the fifth embodiment described above (see (e) of FIG. 19). Accordingly, by continuously performing steps S38 to S44 for the reflective photomask that has been processed through the steps up to S58, the projections 1 are formed in the area where the substrate 11 is exposed in the shading region B. The descriptions for steps S38 to S44 are omitted.

Thus, the step of forming the shading region B where the substrate 11 is exposed is integrally performed with the step of forming the plurality of projections 1 in the area where the substrate 11 is exposed to form the projections 1 simultaneously with the exposure of the substrate 11.

According to Example 3, the fine concave-and-convex pattern C is formed in the surface 11b of the substrate 11 using the lithography technique and the etching technique twice and using nanoimprinting once.

(Advantageous Effects of Fifth Embodiment)

According to the method for manufacturing a reflective photomask related to the fifth embodiment, the projections 1 are formed simultaneously with the exposure of the surface 11b of the substrate 11. Accordingly, such a step of forming preliminary projections 1a in the first embodiment does not have to be used, and thus the number of steps in the manufacturing process is reduced more than in the first embodiment. In addition to the advantageous effects described in the first embodiment, the present embodiment can further enhance productivity of the reflective photomask 10.

Sixth Embodiment

Figure 27:
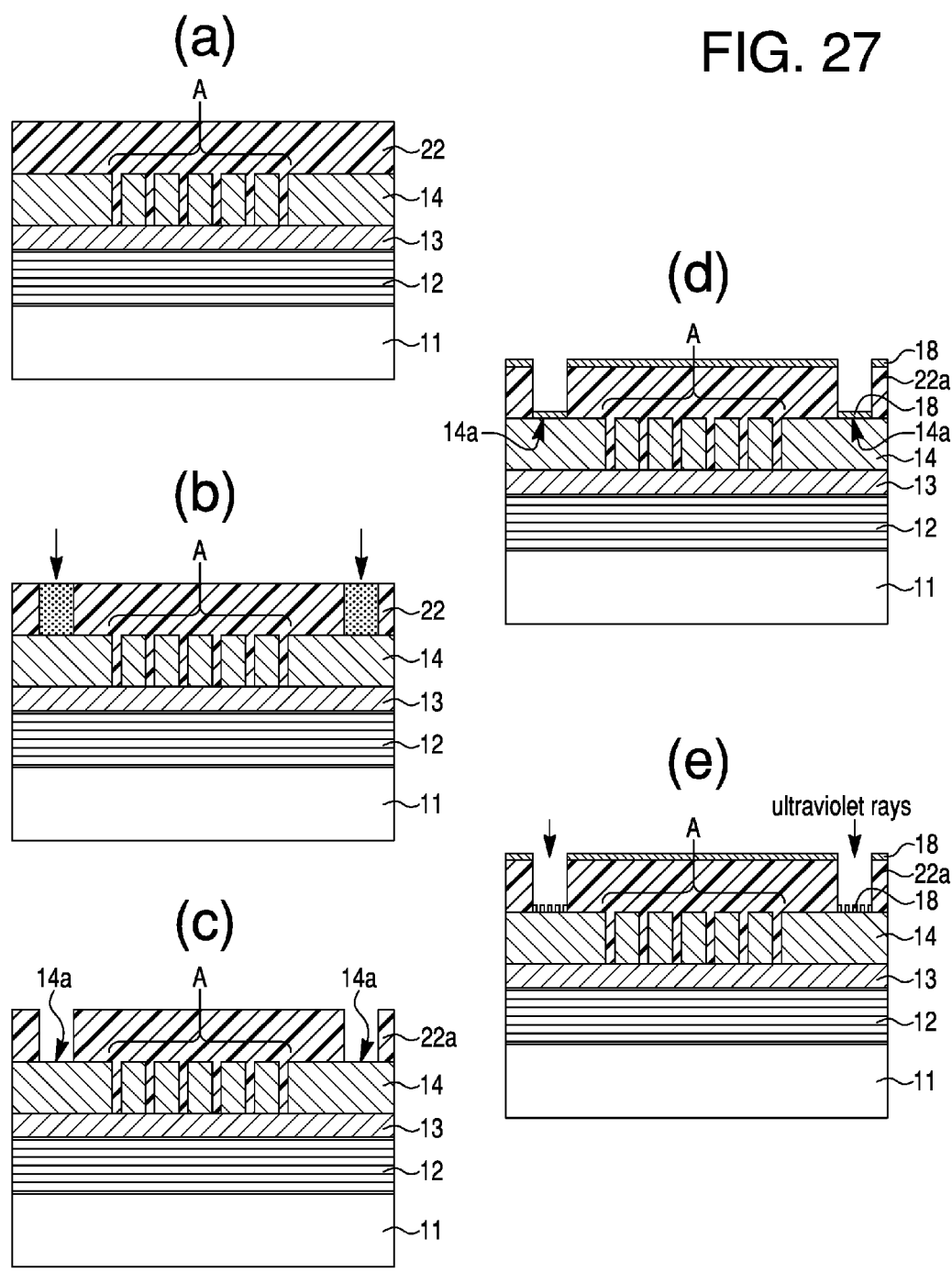
FIG. 27 show cross-sectional views each illustrating a process of manufacturing the reflective photomask according to the sixth embodiment.

Referring to FIGS. 26 and 27, a method for manufacturing a reflective photomask according to the sixth embodiment will be described.

In the sixth embodiment, recesses 18a by a self-assembled monolayer 18 are formed on a surface of the absorption film 14 (upper side in FIG. 27). Using the recesses 18a, a pattern is formed which is the same as the concave-and-convex pattern C to be formed on the substrate 11 that is exposed in the shading region. After that, the multilayer reflection film 12, the protective film 13, and the absorption film 14 are removed by etching to form the shading region B where the substrate 11 is exposed. In this case, the self-assembled monolayer 18 having the recesses 18a is permitted to serve as an etching mask for etching performed in forming the shading region.

The manufacturing method will be described in detail below. FIG. 26 illustrates a flow chart of a manufacturing process and FIG. 27 illustrates cross sections of a reflective photomask in the course of manufacture. Since the manufacturing method of the sixth embodiment includes the steps that are the same as step S52 and the preceding steps described above ((a) of see FIG. 24), the descriptions of these steps are omitted, and the steps afterward are described below.

Firstly, FIG. 27 illustrates by (a) a reflective photomask processed through the steps up to S52. A rectangular pattern for serving as the shading region B was drawn on the resist 22 by an i-line lithography machine (ALTA) ((b) of FIG. 27: S59), followed by development ((c) of FIG. 27: S60), thereby forming the resist pattern 22a that has an opening formed in the rectangular pattern that is the same as the shading region B. In this case, the opening width of the resist pattern 22a was 3 mm and the rectangular pattern was arranged in a distance of 3 μm outside the circuit pattern region A (10 cm×10 cm) that is arranged in the central portion of the mask.

Then, in an $N_2$ atmosphere, the reflective photomask was immersed, for five minutes, in a toluene anhydride solution in which octadecyltrichlorosilane molecules were dissolved. Thus, the self-assembled monolayer 18 containing an octadecyl group at the end was formed on the resist pattern 22a and an exposed surface 14a of the absorption film 14 ((d) of FIG. 27: S61).

Then, ultraviolet rays were irradiated onto the exposed surface 14a of the absorption film 14 via another photomask ((e) of FIG. 27: S62) to modify only the region, where the ultraviolet rays were irradiated, into a silanol group, in the self-assembled monolayer 18 on the surface 14a of the absorption film 14. Thus, the plurality of recesses 18a with a depth of 50 nm were formed on the exposed surface 14a of the absorption film 14, and a concave-and-convex pattern having a hole pattern was formed on the self-assembled monolayer 18.

Since the subsequent steps are the same as steps S40 to S44 in the second embodiment, descriptions on them are omitted. In this way, the step of forming the shading region B where the substrate 11 is exposed is integrally performed with the step of forming the plurality of projections 1 in the area where the substrate 11 is exposed, and thus the projections 1 are formed simultaneously with exposure of the substrate 11.

According to the sixth embodiment, the fine concave-and-convex pattern C is formed on the surface 11b of the substrate 11 using the lithography technique and the etching technique twice and using the self-assembled monolayer 18 once.

(Effects of Sixth Embodiment)

According to the method for manufacturing a reflective photomask of the sixth embodiment, by forming the recesses 18a on the exposed surface 14a of the absorption film 14, the projections 1 can be formed on the substrate 11 without forming the concave-and-convex pattern region $B_0$ on the absorption film 14. These are the advantageous effect obtained in the present embodiment in addition to the advantageous effects of the fifth embodiment.

Seventh Embodiment

Figure 28:
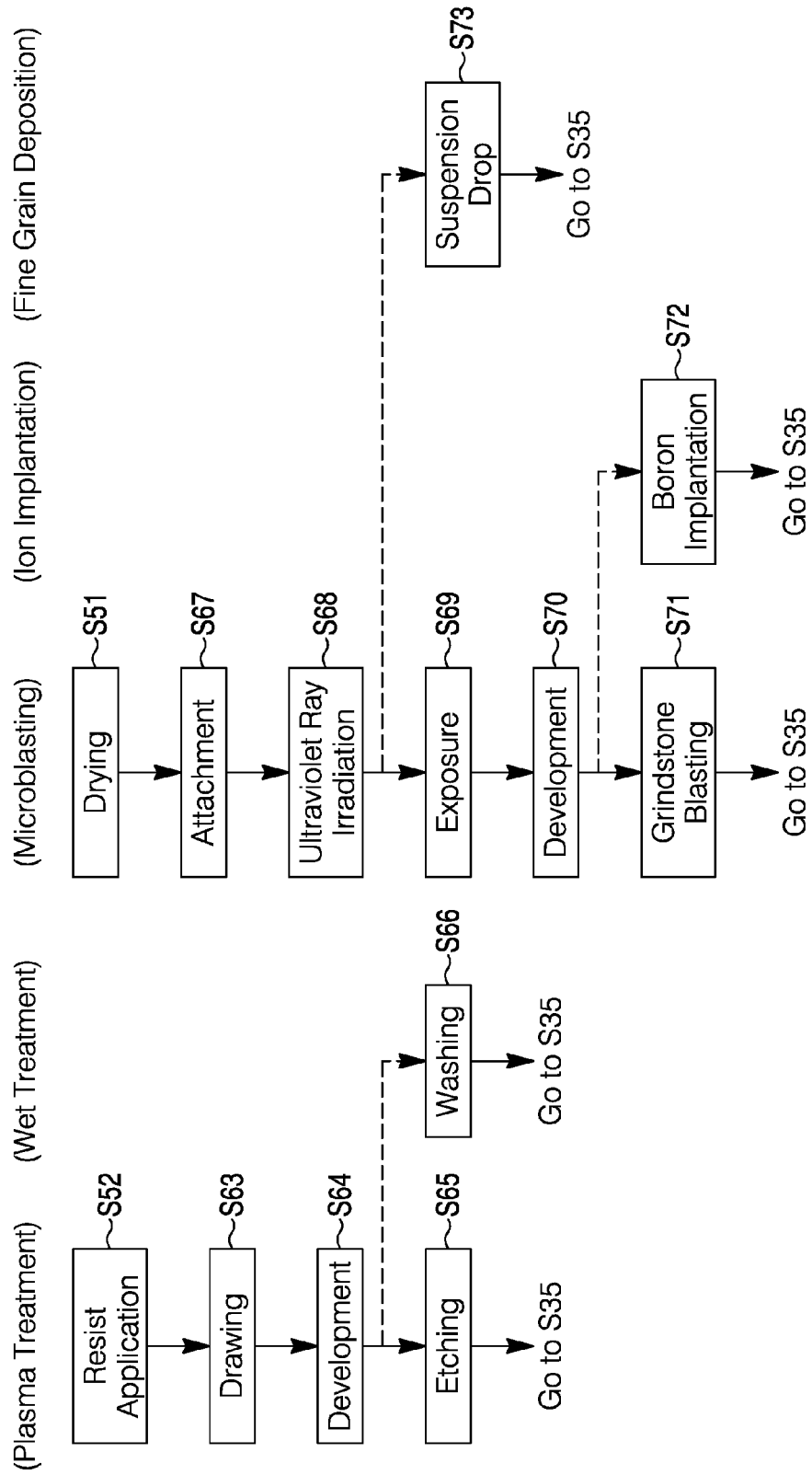
FIG. 28 is a flow chart illustrating a method for manufacturing a reflective photomask according to a seventh embodiment.
Figure 29:
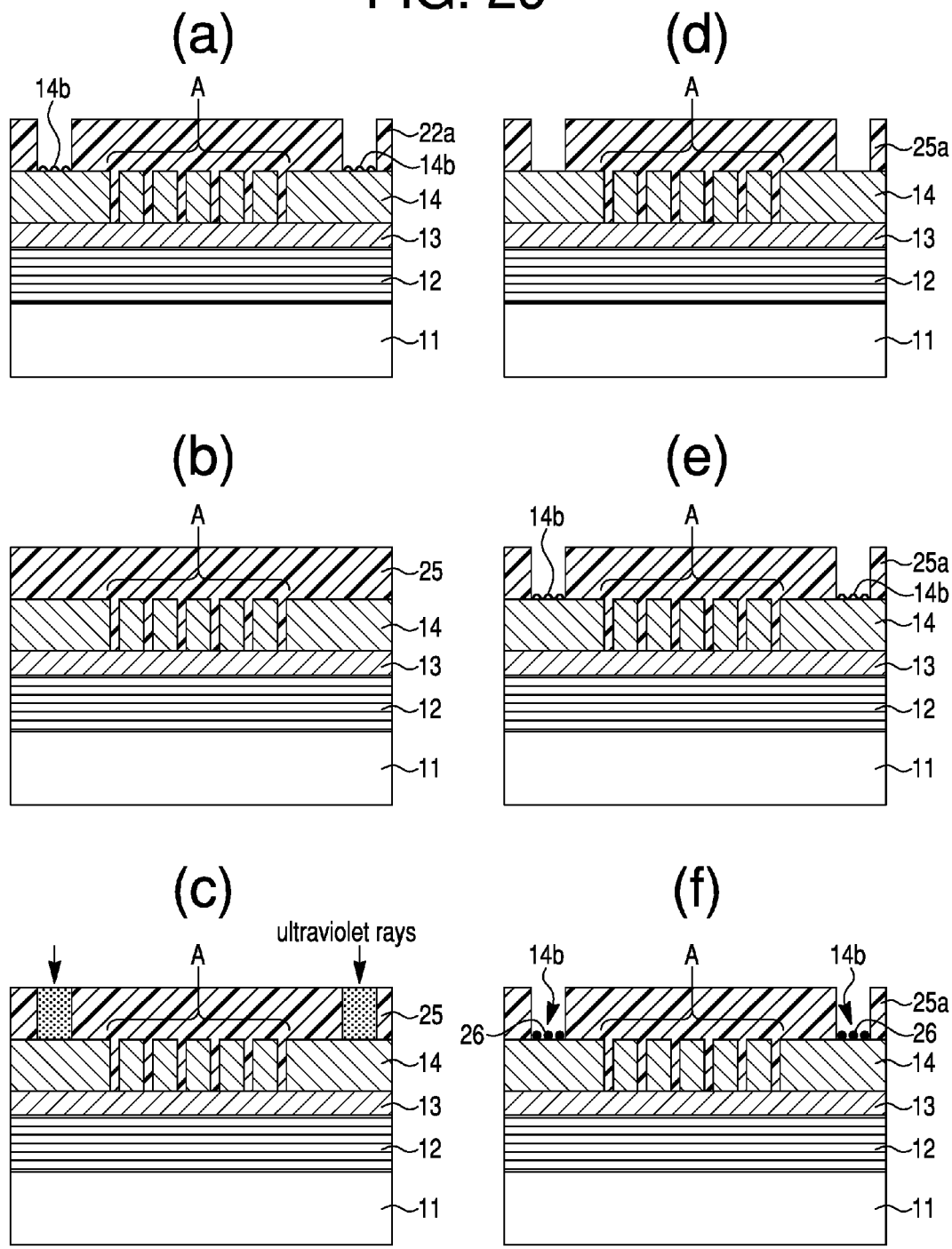
FIG. 29 shows cross-sectional views each illustrating a process of manufacturing the reflective photomask according to the seventh embodiment.

Referring to FIGS. 28 to 30, a method for manufacturing a reflective photomask according to the seventh embodiment will be described.

Similar to the sixth embodiment described above, in the seventh embodiment, the absorption film 14 is not patterned but the surface 14b of the absorption film 14 is subjected to roughening processing to provide a concave-and-convex surface 14b to the absorption film 14. That is, the difference from the sixth embodiment is that a film serving as an etching mask is not formed. Thus, the surface of the absorption film 14 is not permitted to be flat, thereby imparting a level difference to the surface of the absorption film 14. Then, using the concave-and-convex surface 14b, etching is performed to form the shading region B.

The method of providing the concave-and-convex surface 14b to the absorption film 14 includes, for example, a method of damaging a surface of the absorption film by plasma treatment, wet treatment, microblasting, ion implantation, and the like. According to these methods, the surface of the absorption film 14 is formed with roughness without forming a film serving as an etching mask. Using fine grain deposition, the concave-and-convex surface 14b is provided to the absorption film 14 without forming a film as an etching mask and without directly processing the surface of the absorption film 14.

Specific manufacturing methods will be described below for each of the above methods. FIG. 28 illustrates a flow chart of a manufacturing process in each method and FIG. 29 illustrates cross sections of a reflective photomask in the manufacture using each method.

(Plasma Treatment)

Firstly, the description below sets forth a method of providing the concave-and-convex surface 14b to the absorption film 14 in the shading region B by plasma processing. This method includes the steps that are the same as step S52 and the preceding steps of the fifth embodiment (see (a) of FIG. 27). Using an i-line lithography system (ALTA), a region serving as a shading frame is drawn on the reflective photomask (S63) that has been processed through the steps up to step S52 described above. Then, development (S64) is performed to form the resist pattern 22a having an opening in a rectangular pattern that is the same as the shading region B ((a) of FIG. 29).

Then, the reflective photomask is subjected to dry etching using, for example, Ar plasma (S65). Thus, the surface of the absorption film 14 is roughened to thereby form the concave-and-convex surface 14b. Since the subsequent steps are the same as those of Example 2 of the fifth embodiment (refer to S35 to S44), the descriptions on them are omitted. In this way, the concave-and-convex surface 14b can be formed on the surface 11b of the substrate 11 using plasma treatment.

(Wet Treatment)

The description below sets forth a method of providing the concave-and-convex surface 14b to the absorption film 14 in the shading region B by wet treatment. This method includes the steps that are the same as step S64 and the preceding steps of the above method (plasma treatment) ((a) of see FIG. 29).

The reflective photomask that has been processed through the steps up to S64 is washed with an aqueous solution of $NH_4$:HF:$H_2O$, for example, using a washer (not shown) (S66). Thus, the surface of the absorption film 14 is roughened to thereby form the concave-and-convex surface 14b. The subsequent steps are the same as those in the method described above (plasma treatment).

(Microblasting)

The description below sets forth a method of providing the concave-and-convex surface 14b in the absorption film 14 in the shading region B by microblasting. This method includes the steps that are the same as step S51 and the preceding steps described in the fifth embodiment (see (e) of FIG. 24). An ultraviolet curable resist film 25, for example, is attached to the upper surface of the absorption film 14 of the reflective photomask that has been processed through the steps up to S51 (FIG. (b) of 29: S67). The film is attached by thermal pressure bonding using a laminator or the like (not shown).

Then, using an exposure device (not shown), ultraviolet rays are irradiated to the resist film 25 ((c) of FIG. 29: S68). Thus, the resist film 25 is cured in the irradiated area. The reflective photomask is exposed (S69) and developed (S70) to form a resist pattern 25a having an opening in a rectangular pattern that is the same as the shading region B ((d) of FIG. 29).

Then, using a microblasting device (not shown), for example, a resinoid grindstone powder (not shown) is blasted (S71). Thus, the surface of the absorption film 14 is roughened to thereby form the concave-and-convex surface 14b ((d) of FIG. 28). The subsequent steps are the same as those of the above (plasma treatment).

(Ion Implantation)

The description below sets forth a method of providing the concave-and-convex surface 14b in the absorption film 14 in the shading region B by ion implantation. This method includes the steps that are the same as those up to S70 described in the above (plasma treatment) (see (d) of FIG. 29).

Using an ion implantation device (not shown), boron (B), for example, is implanted (S72) to the reflective photomask that has been processed through the steps up to S70 described above. Thus, the surface of the absorption film 14 is roughened to form the concave-and-convex surface 14b (see of (e) FIG. 29). The subsequent steps are the same as those described above (plasma treatment).

The ion implantation has advantageous effects of providing density unevenness in the ions (dopant) implanted to the absorption film 14 and making apparent a difference in the rate of etching derived from the density unevenness, in addition to the advantageous effects of enabling roughening processing of the surface of the absorption film 14.

(Fine Grain Deposition)

The description below sets forth a method of providing the concave-and-convex surface 14b to the absorption film 14 in the shading region B by depositing fine grain on the absorption film 14 in the shading region B. This method has steps that are the same as the steps up to S68 described above (microblasting) (see (d) of FIG. 29).

Using a spin coater, a suspension containing spherical polystyrene latex is dropped (S73) onto the reflective photomask that has been processed through the steps up to S68 described above. Then, the polystyrene latex is uniformly applied onto the surface of the absorption film 14. The applied polystyrene latex aggregates on the surface of the absorption film 14. The size of the aggregated polystyrene latex aggregate 26 is within a range approximately from 60 nm to 80 nm. In this way, a plurality of such polystyrene latex aggregates 26 are distributed on the surface of the absorption film 14 ((f) of FIG. 29). The polystyrene latex in the form of fine grain is deposited and attached to the absorption film 14.

The fine grain attached to the surface of the absorption film 14 causes a level difference on the surface of the absorption film 14 and thus the concave-and-convex surface 14b is provided to the absorption film 14. The subsequent steps are the same as those described above (plasma treatment).

Using each method described above, the step of forming the shading region B where the substrate 11 is exposed is integrally performed with the step of forming the plurality of projections 1 in the area where the substrate 11 is exposed, and thus the projections 1 are formed simultaneously with the exposure of the substrate 11.

According to the seventh embodiment, the fine concave-and-convex pattern C is formed on the substrate 11 in the shading region B using the lithography technique and the etching technique twice and using any one of the above methods once.

(Advantageous Effects of Seventh Embodiment)

Unlike the fifth embodiment, the absorption film 14 is not patterned in the method for manufacturing a reflective photomask according to the seventh embodiment. Accordingly, the number of steps of manufacturing the reflective photomask 10 can be reduced in the seventh embodiment and thus the productivity is enhanced. In addition, unlike the sixth embodiment, a film serving as an etching mask is not formed in the seventh embodiment. Accordingly, the productivity of the reflective photomask 10 can be more enhanced in the seventh embodiment.

In the methods of imparting a damage plasma or the like, or in depositing fine grain, the damage to the film or the fine grain is ensured not to expand to the outside of a predetermined region. To this end, it is desirable that a protective film is formed separately in advance, or a protective film is arranged. The resist 22 and the resist film 25 in the seventh embodiment are equivalent to the protective film.

(Other Matters Associated with the Present Invention)

The reflective photomask according to the present invention is not limited to the ones in the embodiments described above. For example, the EUV light used in the foregoing embodiments has a wavelength of 13.5 nm. However, the wavelength of the EUV light according to the present invention is not limited to this, but other wavelengths, such as of a level of 6 to 7 nm, may be selected.

The reflective film of the reflective photomask according to the present invention is not limited to the multilayer reflection film described in the foregoing embodiments but may be in a single layer. The reflective photomask according to the present invention may be configured without providing a rear surface conductive film to the substrate.

The shading region according to the foregoing embodiments is approximately rectangular in a planar view. However, the shape of the shading region according to the present invention is not limited to this but may be in other shapes, such as square, circular, etc.

The projections according to the foregoing embodiments are formed in the entire area where the substrate is exposed in the shading region. However, the projections according to the present invention are not limited to these projections but may be formed in part of the area where the substrate is exposed, as long as they can minimize the out-of-band light reflection.

Specific embodiments of the present invention have so far been described. However, the present invention should not be construed as being limited by these descriptions. Referring to the descriptions of the present invention, people skilled in the art will obviously understand other embodiments of the present invention together with the various modifications of the embodiments disclosed herein. Accordingly, the claims should be construed as covering the modifications and embodiments encompassed by the scope and the spirit of the present invention.

DESCRIPTION OF REFERENCE SIGNS

1 Projection
3 Side face
9 Reflective Photomask Blank
10 Reflective Photomask
11 Substrate
12 Multilayer reflection film
13 Protective film
14 Absorption film
15 Circuit pattern
A Circuit pattern region
$A_0$ Prospective circuit pattern region
B Shading region
$B_0$ Concave-and-convex pattern Region
P Pitch

What is claimed is:

1. A reflective photomask comprising:
   a substrate;
   a multilayer reflection film formed on the substrate and reflecting exposure light including light with a wavelength of about 5 nm to 15 nm for lithography;
   an absorption film formed on the multilayer reflection film and absorbing the exposure light, and formed therein with one of a circuit pattern and a circuit pattern forming region where the circuit pattern is formed;
   a shading region formed by removing part of the multilayer reflection film and the absorption film on the substrate, on an outer peripheral side of one of the circuit pattern and the circuit pattern forming region to shade part of the exposure light reflected by the multilayer reflection film; and
   a plurality of projections formed at a pitch of about 3000 nm or less on part of a surface of the substrate exposed in the shading region, for suppressing reflection of out-of-band light with a wavelength of about 140 nm to 800 nm included in the exposure light and incident on the shading region.

2. The reflective photomask according to claim 1, characterized in that the projections are formed so as to have a diameter increased from the absorption film side toward the substrate.

3. The reflective photomask according to claim 1, characterized in that the projections each have a side face that is a curved face.

4. The reflective photomask according to claim 2, characterized in that the projections each have a side face that is a curved face.

5. A method for manufacturing a reflective photomask characterized in that the method comprises:
   a step of laminating a multilayer reflection film on a substrate to reflect exposure light including light with a wavelength of about 5 nm to 15 nm for lithography;
   a step of laminating an absorption film on the laminated multilayer reflection film, the absorption film absorbing the exposure light and being formed therein with one of a circuit pattern and a circuit pattern forming region the circuit pattern is formed;
   a step of forming a shading region on an outer peripheral side of one of the circuit pattern and the circuit pattern forming region by removing part of the absorption film and the multilayer reflection film on the substrate, the shading region shading part of the exposure light reflected by the multilayer reflection film; and
   a step of forming a plurality of projections on part of a surface of the substrate exposed in the formed shading region, the projections suppressing reflection of out-of-band light included in the exposure light and having a wavelength of about 140 nm to 800 nm.

6. The method for manufacturing a reflective photomask according to claim 4, characterized in that the step of forming the shading region is integrally performed with the step of forming the plurality of projections to expose the surface of the substrate simultaneously with the formation of the projections.

* * * * *